United States Patent
Fukutomi et al.

(10) Patent No.: US 6,746,897 B2
(45) Date of Patent: Jun. 8, 2004

(54) FABRICATION PROCESS OF SEMICONDUCTOR PACKAGE AND SEMICONDUCTOR PACKAGE

(76) Inventors: Naoki Fukutomi, 8463-5, Yuki, Yuki-shi, Ibaraki-ken (JP), 307; Yoshiaki Tsubomatsu, 24-2, Migimomi, Tsuchiura-shi, Ibaraki-ken (JP), 300; Fumio Inoue, A 403, Hitachi-Kasei-Shihoryo, 1-15-18, Hanabatake, Tsukuba-shi, Ibaraki-ken (JP), 305; Toshio Yamazaki, 203, Hitachi-Matsushiro-House, 3-4-3, Matsushiro, Tsukuba-shi, Ibaraki-ken (JP), 305; Hirohito Ohhata, B 204, Hitachi-Kasei-Shihoryo, 1-15-18, Hanabatake, Tsukuba-shi, Ibaraki-ken (JP), 305; Shinsuke Hagiwara, 1278-302, Tamado, Shimodate-shi, Ibaraki-ken (JP), 308; Noriyuki Taguchi, A 504, Hitachi-Kasei-Shihoryo, 1-15-18, Hanabatake, Tsukuba-shi, Ibaraki-ken (JP), 305; Hiroshi Nomura, 227, Ajito, Oyama-shi, Tochigi-ken (JP), 329-02

( * ) Notice: Subject to any disclaimer, the term of this patent is extended or adjusted under 35 U.S.C. 154(b) by 0 days.

(21) Appl. No.: 10/008,616

(22) Filed: Oct. 23, 2001

(65) Prior Publication Data

US 2002/0039808 A1 Apr. 4, 2002

Related U.S. Application Data

(63) Continuation of application No. 09/487,682, filed on Jan. 19, 2000, which is a division of application No. 09/326,316, filed on Jun. 7, 1999, now abandoned, which is a continuation of application No. 08/716,362, filed on Sep. 18, 1996, now Pat. No. 5,976,912.

(30) Foreign Application Priority Data

| Mar. 18, 1994 | (JP) | 6-48760 |
| Nov. 8, 1994 | (JP) | 6-273469 |
| Jan. 20, 1995 | (JP) | 7-7683 |
| Mar. 15, 1995 | (JP) | 7-56202 |

(51) Int. Cl.[7] ............... H01L 21/44; H01L 21/48; H01L 21/50; H01L 23/48; H05K 1/00
(52) U.S. Cl. ............... 438/110; 257/693; 361/748
(58) Field of Search ............... 438/110; 257/693; 361/748

(56) References Cited

U.S. PATENT DOCUMENTS 3,748,543 A 7/1973 Roberson (List continued on next page.)

FOREIGN PATENT DOCUMENTS

EP 0 091 072 A 10/1983

(List continued on next page.)

OTHER PUBLICATIONS

Matsuo et al., "Smallest Flip–Chip–Like Package Chip Scale Package (CSP)", The Second VLS Packaging Workshop of Japan 1994.
Nikkei Materials & Technology 94.4 (No. 140).

*Primary Examiner*—Wael Fahmy
*Assistant Examiner*—Nema Berezny
(74) *Attorney, Agent, or Firm*—Pennie and Edmonds

(57) ABSTRACT

A semiconductor package substrate is provided, which can meet the move toward high integration of semiconductors. A nickel layer is plated on an electroplated copper foil to form a wiring pattern. An LSI chip is mounted on the copper foil, and terminals of the LSI chip and the wiring pattern are connected by wire bonding, followed by sealing with a semiconductor-sealing epoxy resin. Only the copper foil is dissolved away with an alkali etchant to expose nickel. With a nickel stripper having low copper-dissolving power, the nickel layer is removed to expose the wiring pattern. A solder resist is coated, and a pattern is formed in such a way that connecting terminal portions are exposed. Solder balls are placed at the exposed portions of the wiring pattern and are then fused. The wiring pattern is connected to an external printed board via the solder balls.

14 Claims, 24 Drawing Sheets

U.S. PATENT DOCUMENTS

| | | | |
|---|---|---|---|
| 3,878,555 A | | 4/1975 | Freitag et al. |
| 4,376,287 A | | 3/1983 | Sechi |
| 4,688,150 A | | 8/1987 | Peterson |
| 4,969,257 A | * | 11/1990 | Sato et al. .................... 29/842 |
| 4,975,765 A | | 12/1990 | Ackermann et al. |
| 5,173,766 A | | 12/1992 | Long et al. |
| 5,216,278 A | | 6/1993 | Lin et al. |
| 5,381,039 A | | 1/1995 | Morrison |
| 5,399,903 A | | 3/1995 | Rostoker et al. |
| 5,467,252 A | | 11/1995 | Nomi et al. |
| 5,579,207 A | | 11/1996 | Hayden et al. |

FOREIGN PATENT DOCUMENTS

| | | | |
|---|---|---|---|
| EP | 0391790 A1 | 10/1990 | |
| JP | 59043554 | 3/1984 | |
| JP | 59-043554 | 3/1984 | |
| JP | 59-208756 | 11/1984 | |
| JP | 59208756 | 11/1984 | ........... H01L/23/12 |
| JP | 59231825 | 12/1984 | |
| JP | 59-231825 | 12/1984 | |
| JP | 60160624 | 8/1985 | |
| JP | 60-160624 | 8/1985 | |
| JP | 61222151 | 10/1986 | |
| JP | 01-289273 | 11/1989 | |
| JP | 1289273 | 11/1989 | |
| JP | 2153542 | 6/1990 | |
| JP | 3094430 | 4/1991 | |
| JP | 03-094430 | 4/1991 | |
| JP | 3094459 | 4/1991 | |
| JP | 03-094459 | 4/1991 | |
| JP | 4-26545 | 3/1992 | |
| JP | 4072658 | 3/1992 | |
| JP | 4277636 | 10/1992 | |
| JP | 04-277636 | 10/1992 | |
| JP | 5-129473 | 5/1993 | |
| JP | 6053383 | 2/1994 | |
| WO | WO 09/13991 | 11/1990 | |
| WO | WO 92/21150 | 11/1992 | |

* cited by examiner

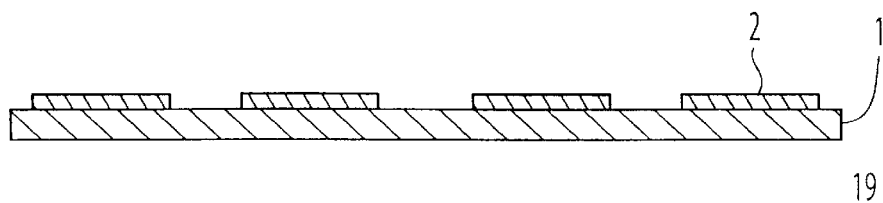
Fig. 11a
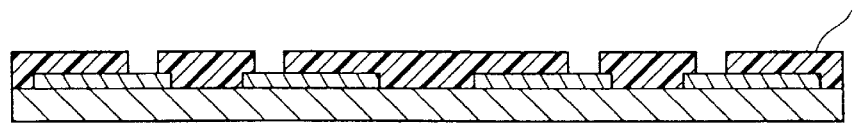
Fig. 11b
Fig. 11c
Fig. 11d
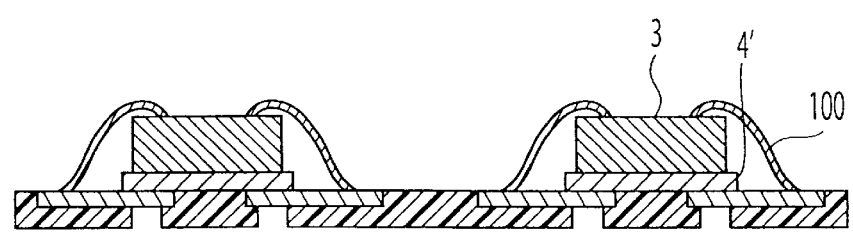
Fig. 11e
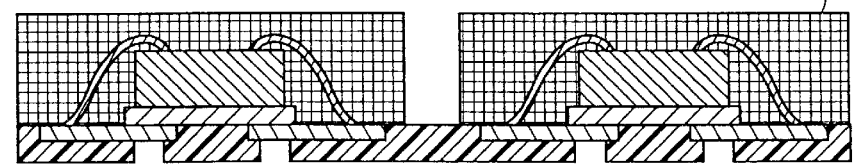
Fig. 11f
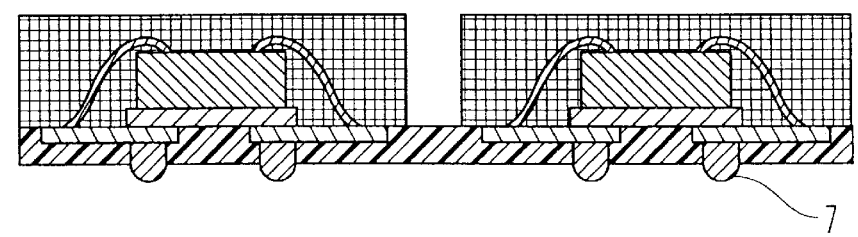
Fig. 11g
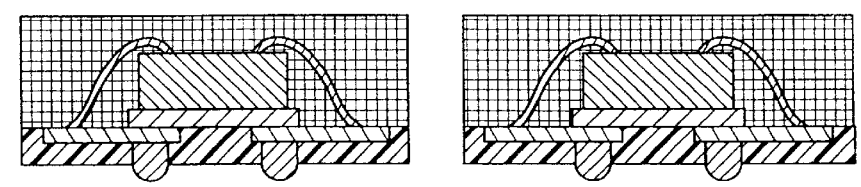

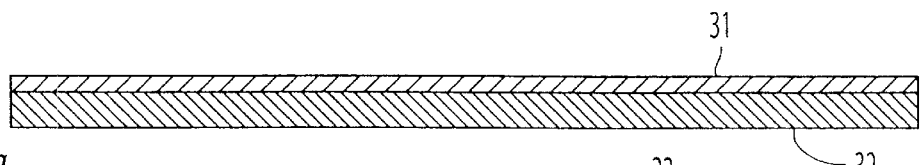
Fig. 17a
Fig. 17b
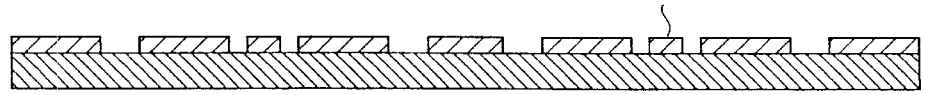
Fig. 17c
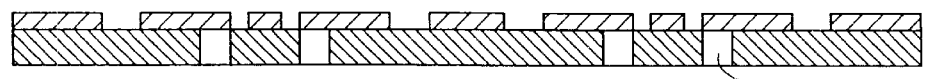
Fig. 17d
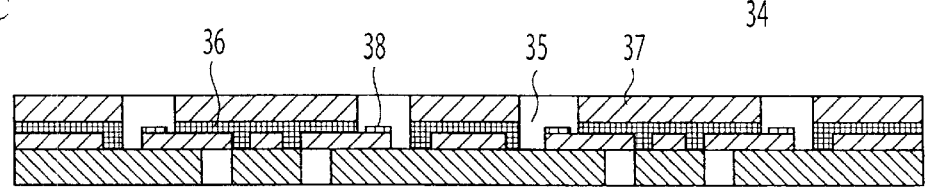
Fig. 17e
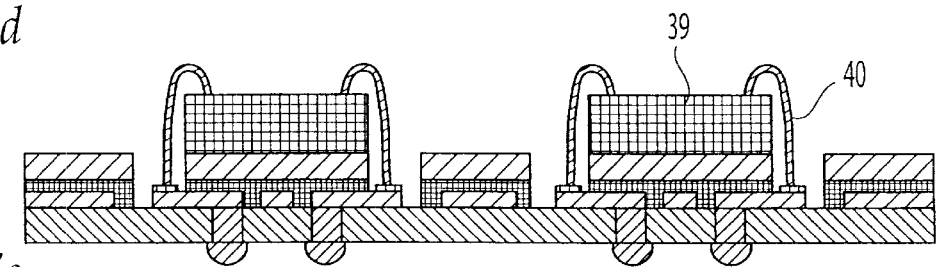
Fig. 17f
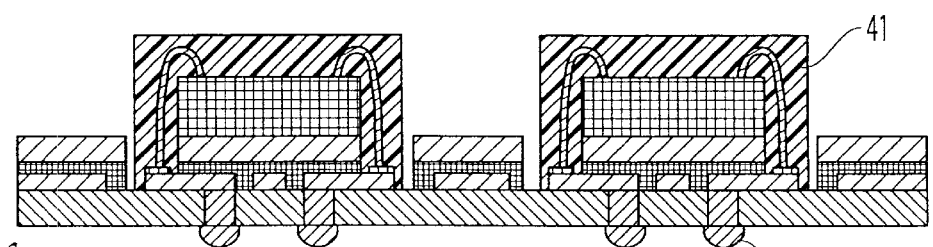
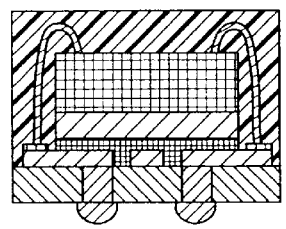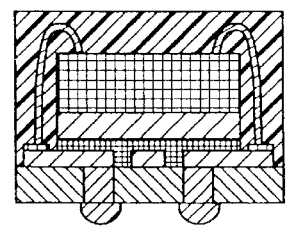
Fig. 17g

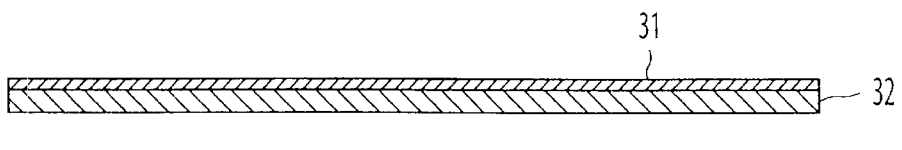
*Fig. 18a*
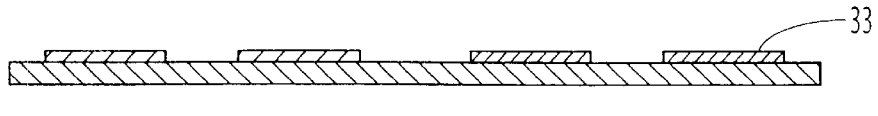
*Fig. 18b*
*Fig. 18c*
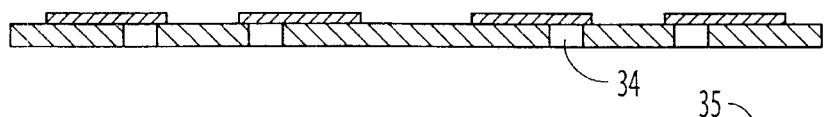
*Fig. 18d*
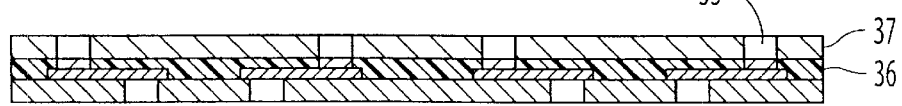
*Fig. 18e*
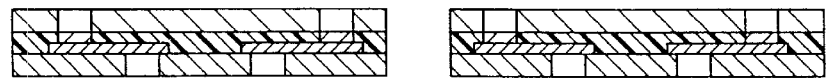
*Fig. 18f*
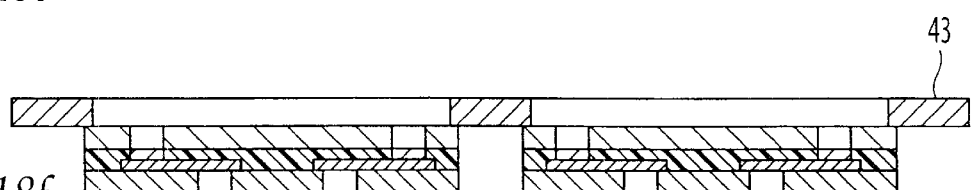
*Fig. 18g*
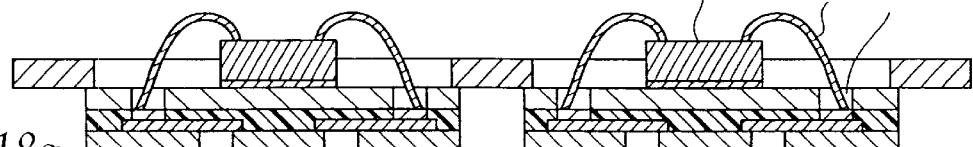
*Fig. 18h*
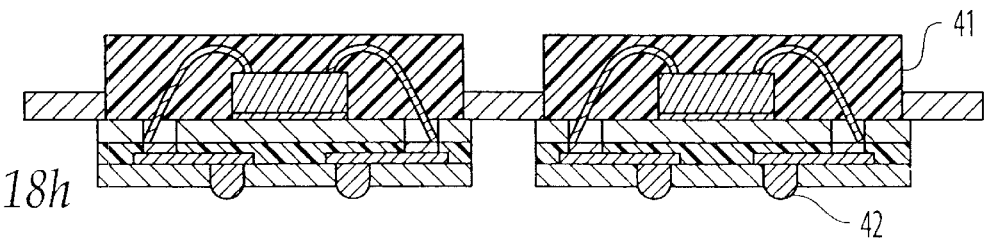
*Fig. 18i*
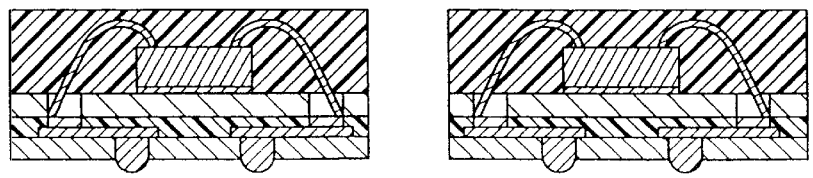

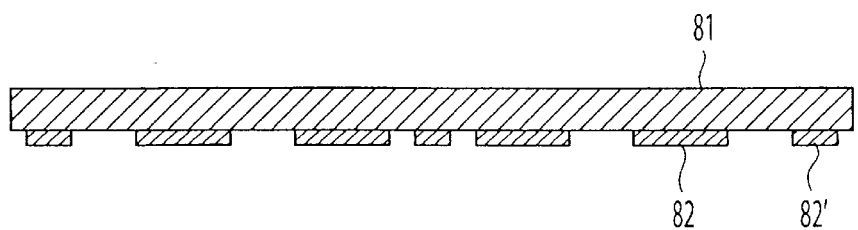
Fig. 25a
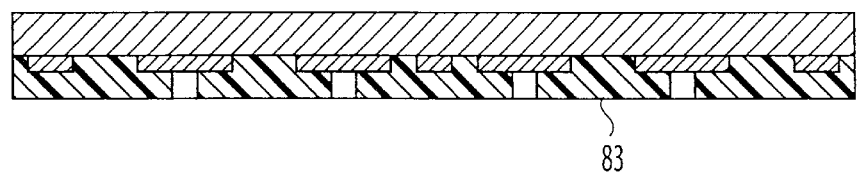
Fig. 25b
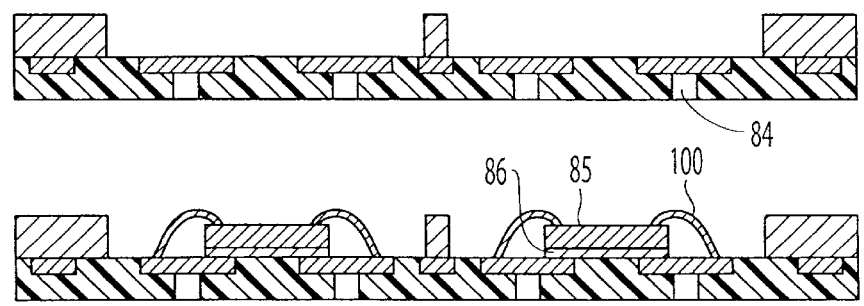
Fig. 25c
Fig. 25d
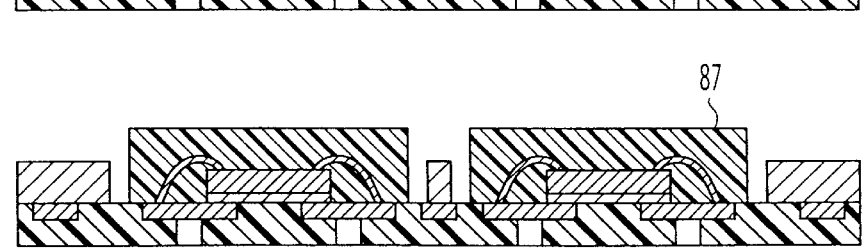
Fig. 25e
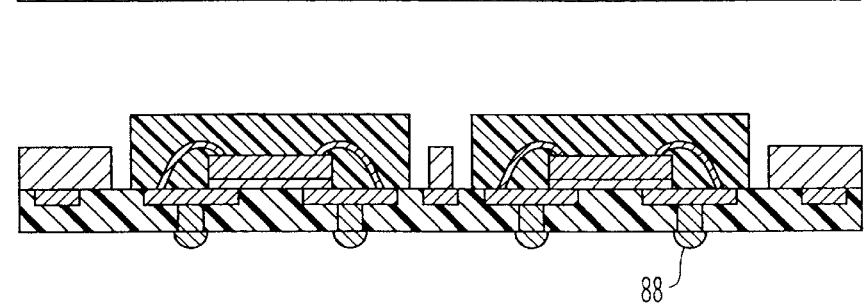
Fig. 25f
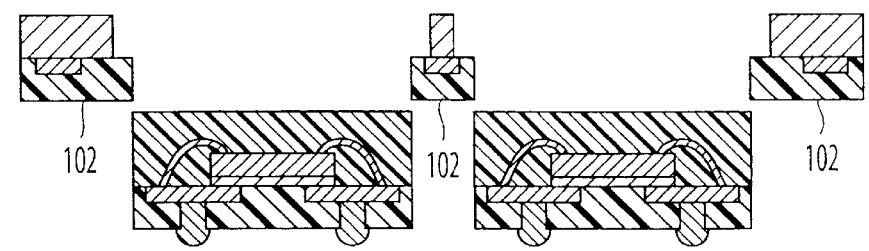
Fig. 25g

US 6,746,897 B2

FABRICATION PROCESS OF SEMICONDUCTOR PACKAGE AND SEMICONDUCTOR PACKAGE

This is a continuation of application Ser. No. 09/487,682 filed Jan. 19, 2000, which is a division of application Ser. No. 09/326,316 filed Jun. 7, 1999, now abandoned, which is a continuation of application Ser. No. 08/716,362 filed Sep. 18, 1996, now U.S. Pat. No. 5,976,912.

TECHNICAL FIELD

This invention relates to a process for the fabrication of a semiconductor package and also to a semiconductor package.

BACKGROUND ART

As the level of integration of semiconductors becomes higher, the number of input/output terminals increases. A need has therefore arisen for a semiconductor package having many input/output terminals. In general, input/output terminals can be divided into two types, one being those arranged in a single row along a periphery of a package and the other being those arranged in multiple arrays not only along a periphery of a package but also inside the package. The former is typified by QFPs (Quad Flat Packages). To provide them with many terminals, it is necessary to reduce the pitch of the the terminals. In a pitch range of 0.5 mm and shorter, an advanced technique is required for their connection with a printed board. The latter array type permits arranging terminals at a relatively large pitch and is hence suited for a high pin count.

Among such array types, PGAs (Pin Grid Array) which are provided with connecting pins have heretofore been commonly used. However, their connections with printed boards are conducted by insertion, so that they are not suited for surface mounting. To overcome this inconvenience, packages called BGAs (Ball Grid Arrays) which permit surface mounting have been developed. These BGAs can be classified into (1) the ceramic type, (2) the printed wiring board type and (3) the tape type making use of TAB (tape automated bonding). Of these, the ceramic type has a shorter distance between a mother board and a package compared with the conventional PGAs so that a warp in the package due to a difference in thermal stress between the mother board and the package remains a serious problem. Further, the printed wiring board type is also accompanied by problems such as substrate warping, low moisture resistance, low reliability and large substrate thickness. Tape BGAs making use of the TAB technology have therefore been proposed.

With a view to meeting a further reduction in the package size, packages having substantially the same size as semiconductor chips, namely, so-called chip size packages (CSP) have been proposed. Each of them has connecting portions, which are to be connected with an external printed board, in a mounting area rather than at a peripheral portion of a semiconductor chip.

Specific examples of such CSPs include those fabricated by bonding a bumped polyimide film to a surface of a semiconductor chip, establishing electrical connection with the chip and gold lead wires, and potting an epoxy resin or the like to seal the resultant package (NIKKEI MATERIALS & TECHNOLOGY, No. 140, pp.18–19, April, 1994) and those obtained by forming metal bumps on a temporary substrate at positions corresponding to points of connection between a semiconductor chip and an external printed board, bonding the semiconductor chip facedown, and subjecting it to transfer molding on the temporary substrate (Smallest Flip-Chip-Like Package CSP; The Second VLSI Packaging Workshop of Japan, pp.46–50, 1994).

On the other hand, packages making use of a polyimide tape as a base film are studied in the fields of BGAs and CSPs as mentioned above. In this case, as the polyimide tape, one having a copper foil laminated on a polyimide film via an adhesive layer is commonly employed. However, from the viewpoint of heat resistance and moisture resistance, one having a polyimide layer formed directly on a copper foil, that is, a so-called two-layer flexible base material, is preferred. Production processes of such two-layer flexible base materials are roughly divided into (1) a process in which polyamic acid as a precursor for a polyimide is coated on a copper foil and is then hardened and (2) a process in which a thin metal film is formed on a hardened polyimide film by vacuum deposition or electroless plating. To provide, for example, holes reaching the copper foil by removing the polyimide at desired portions (which correspond to portions capable of exhibiting a second connecting function) while applying laser beam machining, it is preferred to make the polyimide film as thin as possible. In contrast, upon forming a two-layer flexible base material into the form of a leadframe and handling the same, a base film of a small thickness involves problems such as low handling readiness and insufficient rigidity as a frame.

As has been described above, various proposals have been made as semiconductor packages capable of meeting miniaturization and high integration. Nevertheless, further improvements are desired to provide satisfaction in all aspects such as performance, characteristics and productivity.

An object of the present invention is to provide a process for the fabrication of a semiconductor package, the process making it possible to stably fabricate with good productivity semiconductor packages capable of meeting miniaturization and high integration, and also to provide such a semiconductor package.

DISCLOSURE OF THE INVENTION

In a first aspect of the present invention, there is thus provided a process for the fabrication of a semiconductor package, which comprises the following steps:
  1A) forming wiring on one side of a conductive temporary supporting member;
  1B) mounting a semiconductor device on the conductive temporary supporting member on which the wiring has been formed, and then electrically connecting a terminal of the semiconductor device with the wiring;
  1C) sealing the semiconductor device with resin;
  1D) removing the conductive temporary supporting member to expose the wiring;
  1E) forming an insulating layer over the exposed wiring at an area other than a position where an external connection terminal is to be formed; and
  1F) forming the external connection terminal on the wiring at the positions where the insulating layer has not been formed.

In a second aspect of the present invention, there is also provided a process for the fabrication of a semiconductor package, which comprises the following steps:
  2A) forming wiring on one side of a conductive temporary supporting member;
  2B) forming an insulating supporting member over the one side of the conductive temporary supporting member, the one side carrying the wiring formed thereon;

2C) removing the conductive temporary supporting member and then transferring the wiring onto the insulating supporting member;

2D) removing the insulating supporting member at positions where an external connection terminal is to be formed for the wiring, whereby a through-holes is formed for the external connection terminal;

2E) mounting a semiconductor device on the insulating supporting member on which the wiring has been transferred, and then electrically connecting a terminal of the semiconductor device with the wiring;

2G) sealing the semiconductor device with resin; and 2H) forming, in the through-hole for the external connection terminal, the external connection terminal so that the external connection terminal is electrically connected to the wiring.

In the second aspect of the invention, it is preferable to proceed from 2A to 2H; here, step 2D can come before 2B. For example, step 2B can be conducted by bonding an insulating film insulating supporting member previously provided with an external connection terminal through-hole with one side of the conductive temporary supporting member, the one side carrying the wiring pattern formed thereon.

In a third aspect of the present invention, there is also provided a process for the fabrication of a semiconductor package, which comprises the following steps:

3A) forming wiring on one side of a conductive temporary supporting member;

3B) mounting a semiconductor device on the conductive temporary supporting member on which the wiring has been formed, and then electrically connecting a terminal of the semiconductor device with the wiring;

3C) sealing the semiconductor device with resin;

3D) removing the conductive temporary supporting member at an area other than positions where an external connection terminal for the wiring is to be formed, whereby the external connection terminal made from the conductive temporary supporting member is formed; and 3E) forming an insulating layer at the area other than the position of the external connection terminal.

In a fourth aspect of the present invention, there is also provided a process for the fabrication of a semiconductor package, which comprises the following steps:

4A) forming a wiring on one side of a conductive temporary supporting member;

4B) mounting a semiconductor device on the conductive temporary supporting member on which the wiring has been formed, and then electrically connecting a terminal of the semiconductor device with the wiring;

4C) sealing the semiconductor device with resin;

4D) forming a metal pattern, which is different in conditions for removal from the conductive temporary supporting member, on another side of the conductive temporary supporting member, the another side being opposite to the one side where the semiconductor device has been mounted, at a position where an external connection terminal for the wiring is to be formed; and 4E) removing the conductive temporary supporting member at an area other than the position where the metal pattern has been formed.

As a metal pattern, it is preferable to use solder. Further, gold layer on nickel layer can be used.

In a fifth aspect of the present invention, there is also provided a process for the fabrication of semiconductor packages, which comprises the following steps:

5A) forming plural sets of wiring on one side of an insulating supporting member;

5B) removing the insulating supporting member at positions where external connection terminals for the wiring are to be formed, whereby through-holes for the external connection terminals are provided;

5C) mounting semiconductor devices on the insulating supporting member on which the plural sets of wiring have been formed, and then electrically connecting terminals of the semiconductor devices with the wiring, respectively;

5D) sealing the semiconductor devices with resin;

5E) forming, in the through-holes for the external connection terminals, the external connection terminals so that the external connection terminals are electrically connected to the wiring; and 5F) separating the resultant assembly into individual semiconductor packages.

In the fifth aspect of the invention, it is preferable to proceed from 5A to 5F. However, 5A and 5B can be reversed. In other words, a plurality of sets of wiring can be formed on an insulating supporting member provided with through-holes for external connection terminals.

In a sixth aspect of the present invention, there is also provided a process for the fabrication of semiconductor packages, which comprises the following steps:

6A) forming plural sets of wiring on one side of a conductive temporary supporting member;

6B) cutting apart the conductive temporary supporting member so that the plural sets of wiring formed on the conductive temporary supporting member are divided to include a predetermined number of wiring per unit, and then fixing on a frame the separated conductive temporary supporting member with the wiring formed thereon;

6C) mounting semiconductor devices on the conductive temporary supporting members on which the wiring has been formed, and then electrically connecting terminals of the semiconductor devices with the wiring, respectively;

6D) sealing the semiconductor devices with resin;

6E) removing the conductive temporary supporting member to expose the wiring;

6F) forming an insulating layer over the exposed wiring at areas other than positions where external connection terminals are to be formed;

6G) forming the external connection terminals at the positions where the insulating layer for the wiring has not been formed; and 6H) separating the resultant assembly into individual semiconductor packages.

The predetermined number of wiring per unit in step 6B is preferred to be one. However, in order to improve productivity, it can be more than one.

In a seventh aspect of the present invention, there is also provided a process for the fabrication of semiconductor packages, which comprises the following steps:

7A) forming plural sets of wiring on one side of an insulating supporting member;

7B) removing the insulating supporting member at positions where external connection terminals for the wiring are to be formed, whereby through-holes for the external connection terminals are provided;

7C) cutting apart the insulating supporting member so that the plural sets of wiring formed on the insulating supporting member are divided to include a predetermined number of wiring per unit, and then fixing on a frame the separated insulating supporting member with the wiring formed thereon;

7D) mounting semiconductor devices on the insulating supporting members on which the wiring have been formed, and then electrically connecting terminals of the semiconductor devices with the wiring, respectively;

7E) sealing the semiconductor devices with resin;

7F) forming, in the through-holes for the external connection terminals, the external connection terminals so that the external connection terminals are electrically connected to the wiring; and 7G) separating the resultant assembly into individual semiconductor packages.

In the fabrication process, it is preferable to proceed from 7A to 7G. However, 7A and 7B can be reversed as in the fifth aspect of the invention.

In an eighth aspect of the present invention, there is also provided a process for the fabrication of a semiconductor package provided with a single layer of wiring, one side of the wiring having a first connecting function of being connected with a semiconductor device and an opposite side of the wiring having a second connecting function of being to be connected to external wiring, which comprises the following steps 8A, 8B, 8C and 8D:

8A) working a heat-resistant insulating base material having a metal foil, thereby forming the metal foil into plural sets of wiring patterns;

8B) forming a hole at a position for exhibiting the second connecting function which is to be formed in a subsequent step, so that the hole extends from a side of the insulating base material to the wiring patterns;

8C) bonding a frame base material, which makes an opening through a predetermined portion thereof, to desired position on a surface of the wiring patterns and a surface of the insulating base material, the latter surface being located adjacent the wiring patterns, respectively; and 8D) mounting the semiconductor device, electrically connecting a terminal of the semiconductor device with the wiring pattern, and then sealing the semiconductor device with resin.

In the eight aspect of the invention, it is preferable to proceed from 8A to 8D. However, 8A and 8B can be reversed. In other words, metal foil can be formed into wiring patterns after a hole is formed on the insulating base material to extend to the metal foil.

In a ninth aspect of the present invention, there is also provided a process for the fabrication of semiconductor packages provided with a single layer of a wiring, one side of the wiring having a first connecting function of being connected with a semiconductor device and an opposite side of the wiring having a second connecting function of being to be connected to external wiring, which comprises the following steps 9A, 9B, 9C and 9D:

9A) working a heat-resistant insulating base material having a metal foil, thereby forming the metal foil into plural sets of wiring patterns;

9B) forming a hole at a position for exhibiting the second connecting function which is to be formed in a subsequent step, so that the hole extends from a side of the insulating base material to the wiring patterns;

9C) bonding a second insulating base material, which makes an opening through a predetermined portion thereof, to a desired position on a surface of the wiring patterns and a surface of the insulating base material, the latter surface being located adjacent to the wiring patterns, respectively, whereby an insulating supporting member is formed;

9D) cutting apart the insulating supporting member so that the plural sets of wiring formed on the insulating supporting member are divided to include a predetermined number of wiring per unit, and then fixing on a frame the separated insulating supporting member with the wiring formed thereon; and 9E) mounting the semiconductor device, electrically connecting a terminal of the semiconductor device with the wiring, and then sealing the semiconductor device with resin.

In the ninth aspect of the invention, it is preferable to proceed from 9A to 9E. However, 9A and 9B can be reversed as in the eight aspect of the invention.

In a tenth aspect of the present invention, there is also provided a process for the fabrication of semiconductor packages, which comprises the following steps:

10A) forming plural sets of wiring on one side of a supporting member;

10B) mounting plural semiconductor devices on the supporting member on which the wiring have been formed, and then electrically connecting terminals of the semiconductor devices with the wiring;

10C) subjecting the plural sets of electrically-connected semiconductor device and wiring to gang sealing with resin;

10D) removing desired portions of the supporting member to expose predetermined portions of the wiring, and forming external connection terminals so that the external connection terminals are electrically connected to the exposed wiring; and 10E) separating the resultant assembly into individual semiconductor packages.

Metal foil can be used as the supporting member, and wiring patterns can be exposed by removing the supporting member after sealing with resin.

Further, the supporting member can be an insulating base material, and nonthrough-holes reaching the wiring patterns can be formed by removing a predetermined section of an insulating base material after sealing with resin.

In an eleventh aspect of the present invention, there is also provided a process for the fabrication of a semiconductor device packaging frame, the frame being provided with plural semiconductor-device-mounting portions, portions connecting the plural semiconductor-device-mounting portions, and a registration mark portion, which comprises the following steps:

(a) forming wiring for the semiconductor-device-mounting portions on a conductive temporary substrate, (b) transferring the wiring onto a resin substrate, and (c) etching off the conductive temporary substrate;

wherein upon etching off the conductive temporary substrate in step (c), the conductive temporary substrate partly remains to form some of the connecting portions.

In the present invention, usual semiconductor devices such as LSI chips or IC chips can be used as the semiconductor devices.

To electrically connect the terminal of the semiconductor device with the wiring, it is possible to use not only wire bonding but also usual means such as a bump or an anisotropic conductive film.

In the present invention, a warp-free and deformation-free semiconductor package can be fabricated by subjecting a hardened sealing resin to heat treatment after a semiconductor device is sealed with resin.

The heat treatment can be conducted preferably at a temperature in a range of the glass transition point of the hardened sealing resin ±20° C., because the hardened resin exhibits strongest plastic properties in the range of the glass transition point of the hardened sealing resin ±20° C., thereby facilitating elimination of residual strain. If the temperature of the heat treatment is lower than the glass transition point −20° C., the hardened resin becomes a glassy elastic substance so that relaxation effects tend to be lessened. If the temperature is higher than the glass transition point +20° C., the hardened resin turns to a rubbery elastic substance so that effect of strain elimination also tend to be reduced.

A warp or deformation in the semiconductor package can be more completely eliminated by cooling the semiconductor package to room temperature at a temperature-lowering rate of 5° C./min or less after the semiconductor package is heat-treated at a temperature in the temperature of the glass transition point of the hardened sealing resin ±20° C.

It is preferred to conduct the heat-treatment and/or cooling step while pressing upper and lower surfaces of the hardened sealing resin by rigid flat plates under forces that reduce a warp or deformation in the hardened sealing resin.

In the semiconductor package according to the present invention, the wiring, where it is a single-layer wiring, is designed so that one side of the wiring has a first connecting function for permitting connection with the semiconductor chip and an opposite side of the wiring has a second connecting function enabling connection to the external wiring.

For the external connection terminals which are to be connected to the external wiring, solder bumps, gold bumps or the like can preferably be used.

From the standpoint of high densification, it is preferred to arrange the external connection terminals on a side further inward than a position where terminals of the semiconductor device are electrically connected by wire bonding or the like (fan-in type). As is understood from the foregoing, it is preferred from the standpoint of high densification to arrange the external connection terminals in a grid-like pattern on a lower side on which the semiconductor device is mounted.

BRIEF DESCRIPTION OF THE DRAWINGS

FIG. 11 is a cross-sectional view illustrating a process according to an embodiment of the present invention for the fabrication of a semiconductor package;

FIG. 17 is a cross-sectional view illustrating a process according to an embodiment of the present invention for the fabrication of a semiconductor package;

FIG. 18 is a cross-sectional view illustrating a process according to an embodiment of the present invention for the fabrication of a semiconductor package;

FIG. 25 is a cross-sectional view illustrating the process according to an embodiment of the present invention for the fabrication of the semiconductor package.

BEST MODE FOR CARRYING OUT THE INVENTION

With reference to FIG. 1, a description will be given of the first embodiment of the present invention.

Figure 1A:
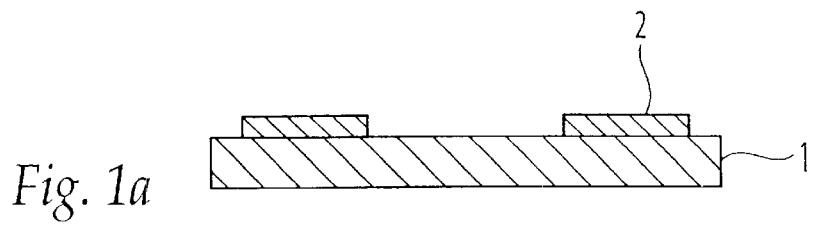
FIG. 1 is a cross-sectional view illustrating a process according to an embodiment of the present invention for the fabrication of a semiconductor package.
Figure 1B:
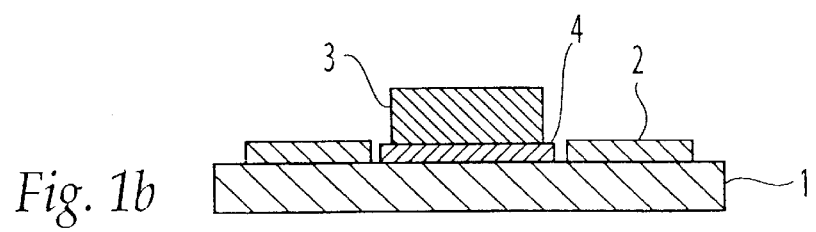
Figure 1C:
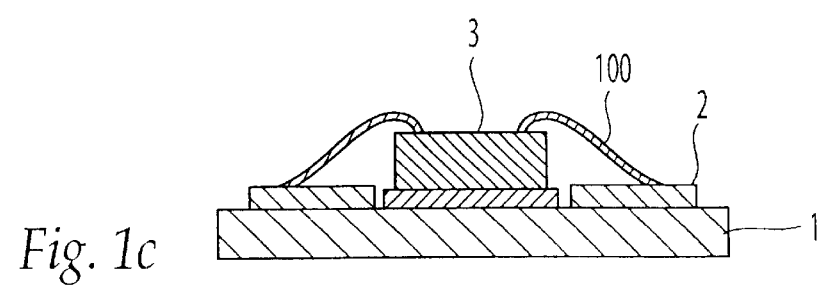
Figure 1D:
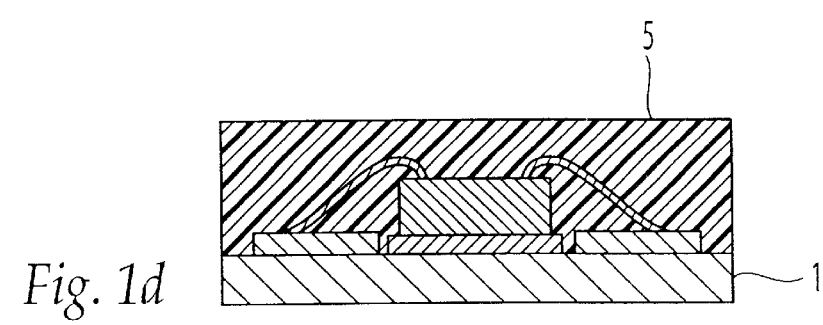
Figure 1E:
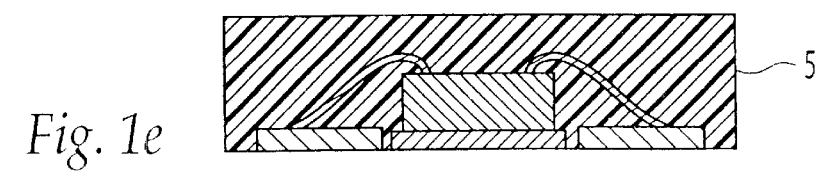
Figure 1F:
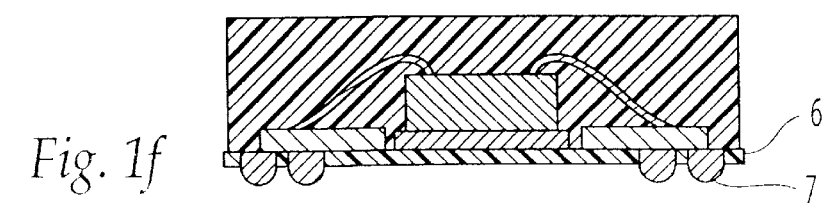

A nickel layer of 0.001 mm in thickness (not shown in FIG. 1) is plated on one side of an electrolytic copper foil 1 of 0.035 mm in thickness. Next, a photosensitive dry film resist ("PHOTEC HN340", trade name; product of Hitachi Chemical Co., Ltd.) is laminated, exposed and then developed, so that a plating resist for wiring pattern is formed. Subsequently, electrolytic copper plating is conducted in a copper sulfate bath. Applied further are a nickel plating to a thickness of 0.003 mm or greater and a gold plating of 99.9% or higher purity to a thickness of 0.0003 mm or greater. The plating resist is next stripped off, whereby a wiring is formed (FIG. 1a). On the copper foil 1 with the wiring 2 formed thereon as described above, an LSI chip 3 is mounted (FIG. 1b). For bonding the LSI chip, a silver paste 4 for semiconductors is used. Next, LSI terminals and the wiring 2 are connected by wire bonds 100 (FIG. 1c). The thus-formed assembly was loaded in a die for transfer mold and sealed with a semiconductor-sealing epoxy resin ("CL-7700", trade name; product of Hitachi Chemical Co., Ltd.) 5 (FIG. 1d). Thereafter, only the copper foil 1 was dissolved away with an alkali etchant to expose the nickel. The nickel layer is removed with a nickel stripper having low copper-dissolving power so that the wiring portions were exposed (FIG. 1e). Then, a solder resist 6 was coated and patterned in such a way that connecting terminal portions were exposed. Solder balls 7 were arranged at the exposed portions of the wiring and were caused to fuse there (FIG. 1f). The wiring can be connected to an outer wiring via these solder balls 7.

Referring to FIG. 2, a description will be given of the second embodiment of the present invention.

Figure 2A:
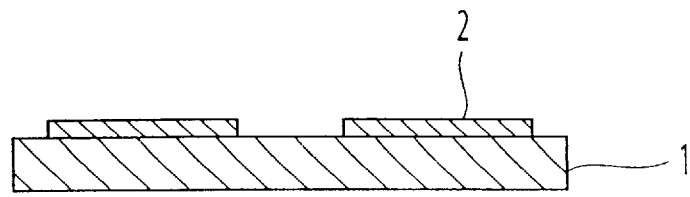
FIG. 2 is a cross-sectional view illustrating a process according to an embodiment of the present invention for the fabrication of a semiconductor package.
Figure 2B:
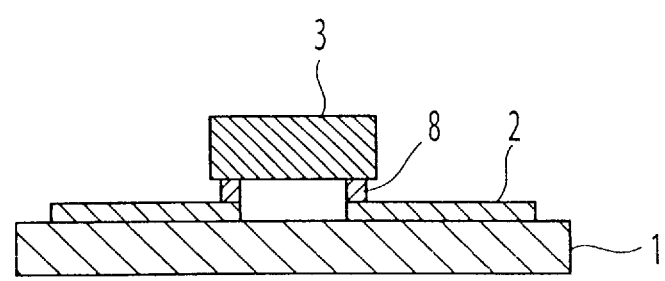
Figure 2C:
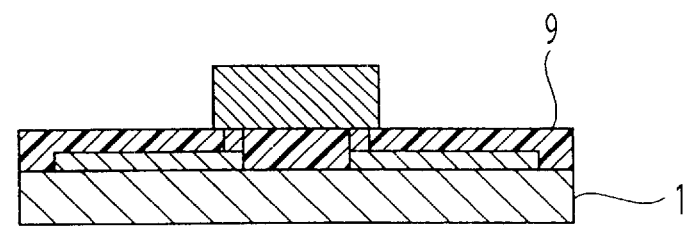
Figure 2D:
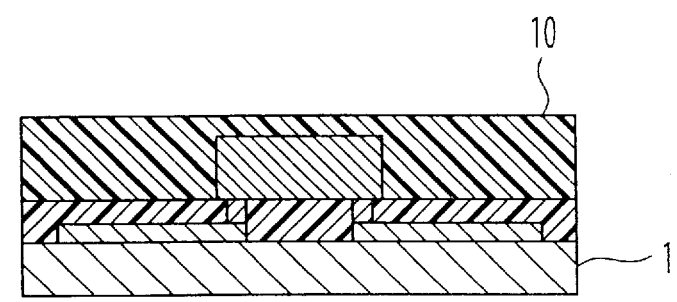
Figure 2E:
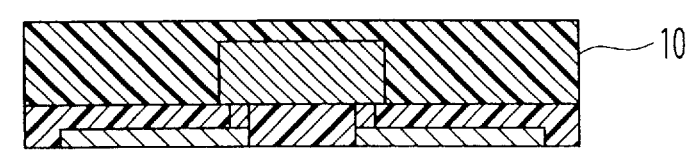
Figure 2F:
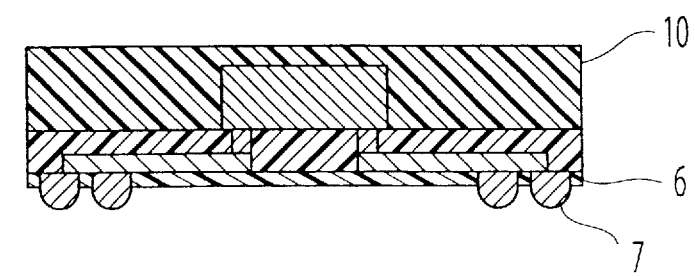

Following the procedures of FIG. 1, a copper foil 1 with a wiring 2 was prepared (FIG. 2a). An LSI chip 3 is mounted. The LSI chip is provided with gold bumps 8 at terminal portions. These gold bumps 8 and terminal portions of the wiring 2 are connected together by thermocompression (FIG. 2b). Next, a liquid epoxy resin 9 is filled underneath the LSI chip and cured (FIG. 2c). The thus-formed assembly was loaded in a die for transfer mold and sealed with a semiconductor-sealing epoxy resin ("CL-7700", trade name; product of Hitachi Chemical Co., Ltd.) 10 (FIG. 2d). Thereafter, only the copper foil 1 was dissolved away with an alkali etchant to expose the nickel. The nickel layer was removed with a nickel stripper having low copper-dissolving power so that the wiring portions were exposed (FIG. 2e). Then, a solder resist 6 was coated and patterned in such a way that connecting terminal portions were exposed. Solder balls 7 were arranged at the exposed portions of the wiring and were caused to fuse there (FIG. 2f). The wiring can be connected to an outer wiring via these solder balls 7.

With reference to FIG. 3, a description will be given of the third embodiment of the present invention.

Figure 3A:
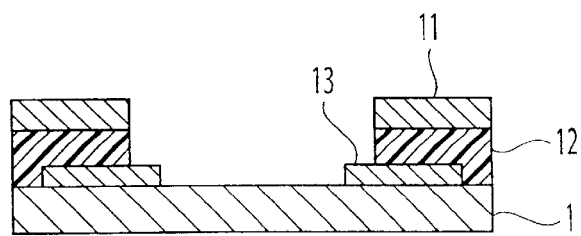
FIG. 3 is a cross-sectional view illustrating a process according to an embodiment of the present invention for the fabrication of a semiconductor package.
Figure 3B:
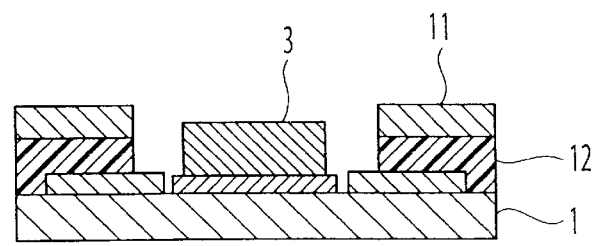
Figure 3C:
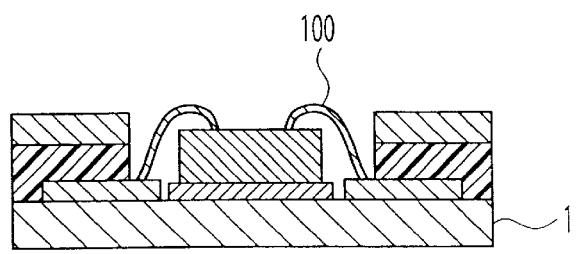
Figure 3D:
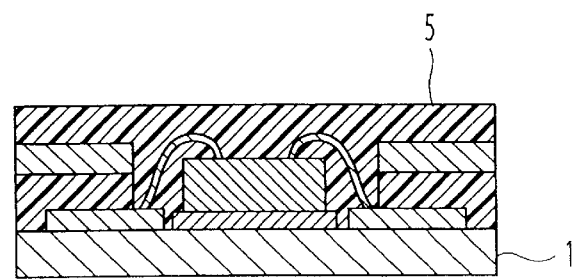
Figure 3E:
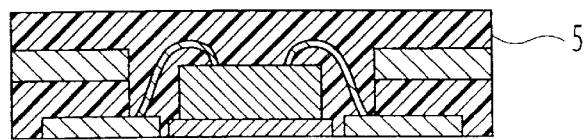
Figure 3F:
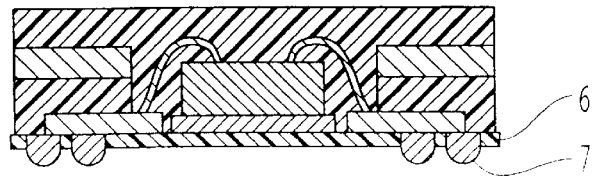

A nickel layer of 0.001 mm in thickness (not shown in FIG. 3) is plated on one side of an electrolytic copper foil 1 of 0.035 mm in thickness. Next, a photosensitive dry film resist ("PHOTEC HN340", trade name; product of Hitachi Chemical Co., Ltd.) is laminated, exposed and then developed, so that a plating resist for wiring pattern is formed. Subsequently, electrolytic copper plating is conducted in a copper sulfate bath, so that a first wiring 13 is formed. The plating resist is next stripped off and the first wiring 13 is subjected at a surface thereof to oxidation treatment and reduction treatment. Using a fresh copper foil and a polyimide-base bonding film ("AS2210", trade name; product of Hitachi Chemical Co., Ltd.) 12 as a bonding resin, they are laminated and bonded so that the wiring 13 is positioned inside. (Holes of 0.1 mm in diameter are formed through the copper foil 11 by a conventional photoetching process. By a panel plating process, inner walls of the holes and the entire surface of the copper foil are plated with copper.) The copper foil is formed into a second wiring 11 by photoetching. The resin (the polyimide-base bonding film 12) is removed at an LSI-mounting portion by an excimer laser to expose terminal portions. The terminal portions are applied with a nickel plating to a thickness of 0.003 mm or greater and further with a gold plating of 99.9% or higher purity to a thickness of 0.0003 mm or greater (FIG. 3a). On the copper foil 1 with the two-layer wiring pattern formed thereon as described above, an LSI chip is mounted. For bonding the LSI chip, a silver paste for semiconductors was used (FIG. 3b). Next, LSI terminals and the wiring 13 are connected by wire bonds 100 (FIG. 3c). The thus-formed assembly was loaded in a die for transfer mold and sealed with a semiconductor-sealing epoxy resin ("CL-7700", trade name; product of Hitachi Chemical Co., Ltd.) 5. Thereafter, only the copper foil 1 was dissolved away with an alkali etchant to expose the nickel. The nickel layer was removed with a nickel stripper having low copper-dissolving power so that the wiring portions were exposed (FIG. 3e). Then, a solder resist 6 was coated and patterned in such a way that connecting terminal portions were exposed. Solder balls 7 were arranged at the exposed portions and were caused to fuse there (FIG. 3f). The wiring can be connected to an outer wiring via these solder balls 7.

With reference to FIG. 4, a description will be given of the fourth embodiment of the present invention.

Figure 4A:
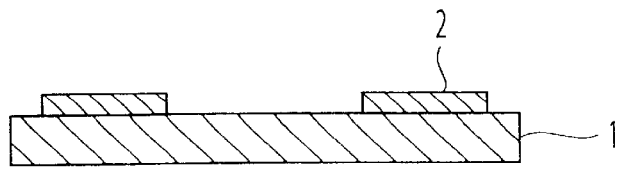
FIG. 4 is a cross-sectional view illustrating a process according to an embodiment of the present invention for the fabrication of a semiconductor package.
Figure 4B:
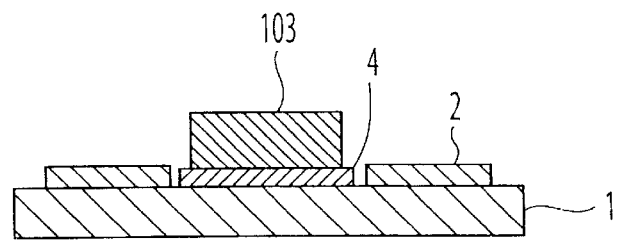
Figure 4C:
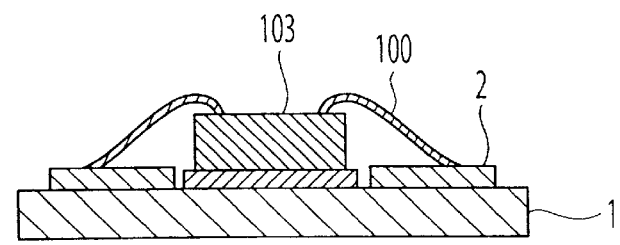
Figure 4D:
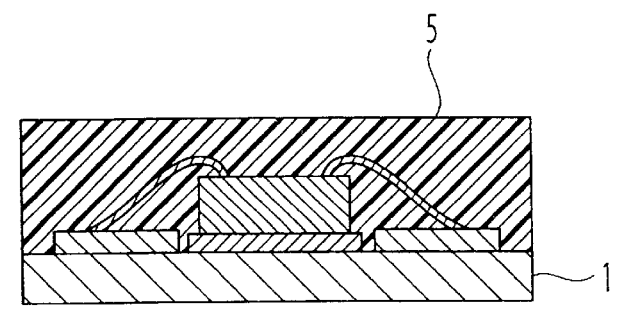
Figure 4E:
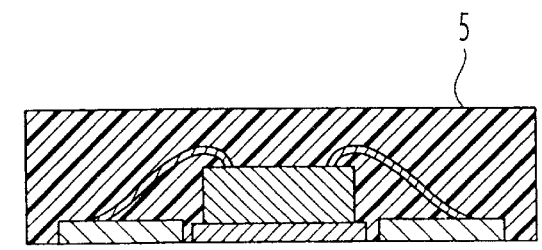
Figure 4F:
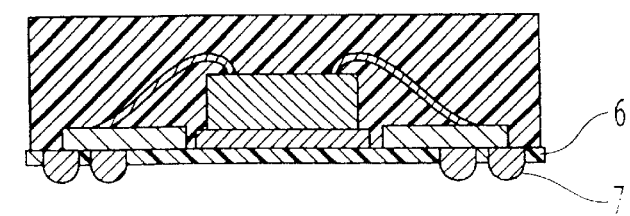

On an SUS (stainless steel) sheet 14 of 0.1 mm in thickness, a photosensitive dry film resist ("PHOTEC HN340", trade name; product of Hitachi Chemical Co., Ltd.) is laminated, exposed and then developed, so that a plating resist for wiring pattern is formed. Subsequently, electrolytic copper plating is conducted in a copper sulfate bath. Applied further are a nickel plating to a thickness of 0.003 mm or greater and a gold plating of 99.9% or higher purity to a thickness of 0.0003 mm or greater. The plating resist is next stripped off, whereby a wiring 2 is formed (FIG. 4a). On the SUS sheet 14 with the wiring 2 formed thereon as described above, a semiconductor chip 103 is mounted (FIG. 4b). For bonding the semiconductor chip, a silver paste 4 for semiconductors was used. Next, semiconductor terminals and the wiring 2 are connected by wire bonds 100 (FIG. 4c). The thus-formed assembly was loaded in a die for transfer mold and sealed with a semiconductor-sealing epoxy resin ("CL-7700", trade name; product of Hitachi Chemical Co., Ltd.) 5 (FIG. 4d). Thereafter, the SUS sheet 14 was mechanically stripped off to expose the wiring portion (FIG. 4e). Then, a solder resist 6 was coated and patterned in such a way that connecting terminal portions were exposed. Solder balls 7 were arranged at the exposed portions of the wiring and were caused to fuse there (FIG. 4f). The wiring can be connected to an outer wiring via these solder balls 7.

With reference to FIG. 5, a description will be given of the fifth embodiment of the present invention.

Figure 5A:
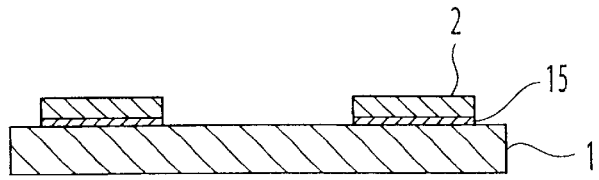
FIG. 5 is a cross-sectional view illustrating a process according to an embodiment of the present invention for the fabrication of a semiconductor package.
Figure 5B:
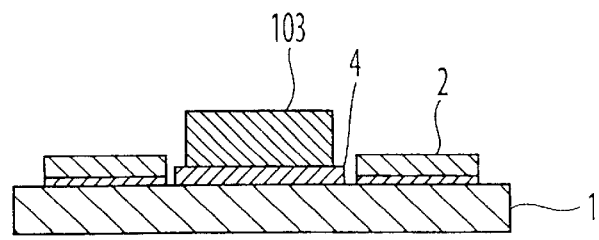
Figure 5C:
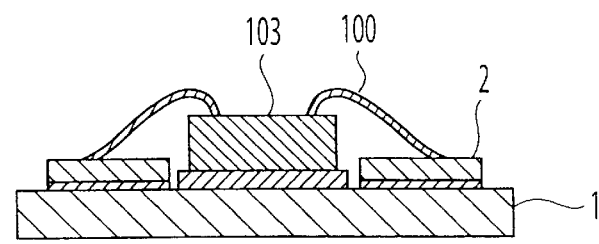
Figure 5D:
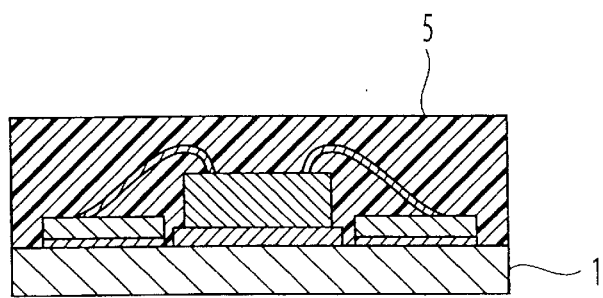
Figure 5E:
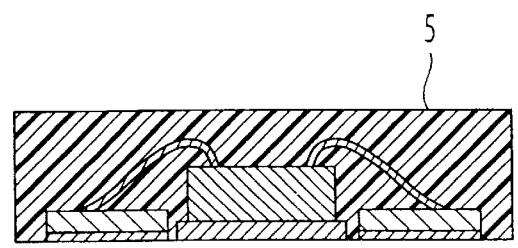
Figure 5F:
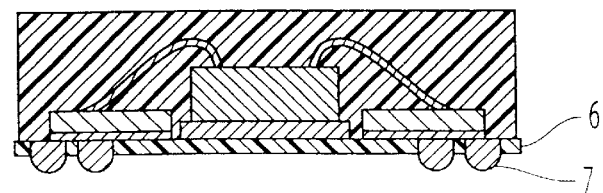

On an electrolytic copper foil of 0.035 mm in thickness, a photosensitive dry film resist ("PHOTEC HN340", trade name; product of Hitachi Chemical Co., Ltd.) is laminated, exposed and then developed, so that a plating resist for wiring pattern is formed. Subsequent to application of a pattern plating 15 of nickel, electrolytic copper plating is conducted in a copper sulfate bath. Applied further are a nickel plating to a thickness of 0.003 mm or greater and a gold plating of 99.9% or higher purity to a thickness of 0.0003 mm or greater. The plating resist is next stripped off, whereby a wiring 2 is formed (FIG. 5*a*). On the copper foil 1 with the wiring 2 formed thereon as described above, a semiconductor chip 103 is mounted (FIG. 5*b*). For bonding the semiconductor chip, a silver paste 4 for semiconductors was used. Next, semiconductor terminal portions and the wiring 2 are connected by wire bonds 100 (FIG. 5*c*). The thus-formed assembly was loaded in a die for transfer mold and sealed with a semiconductor-sealing epoxy resin ("CL-7700", trade name; product of Hitachi Chemical Co., Ltd.) 5 (FIG. 5*d*). Thereafter, the copper foil 1 was dissolved away with an alkali etchant to expose the wiring portions of nickel (FIG. 5*e*). Then, a solder resist 6 was coated and patterned in such a way that connecting terminal portions were exposed. Solder balls 7 were arranged at the exposed portions of the wiring and were caused to fuse there (FIG. 5*f*). The wiring can be connected to an outer wiring via these solder balls 7.

With reference to FIG. 6, a description will be given of the sixth embodiment of the present invention.

Figure 6A:
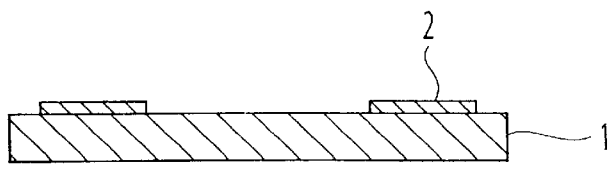
FIG. 6 is a cross-sectional view illustrating a process according to an embodiment of the present invention for the fabrication of a semiconductor package.
Figure 6B:
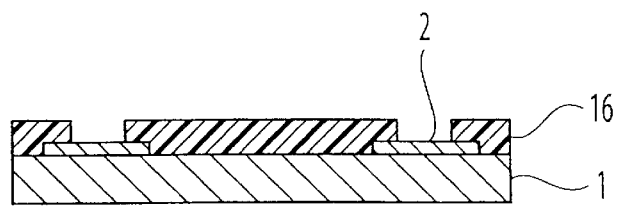
Figure 6C:
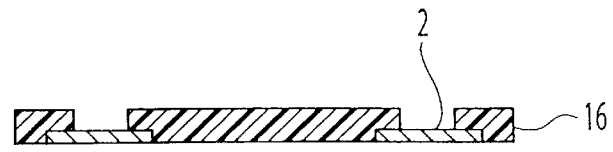
Figure 6D:
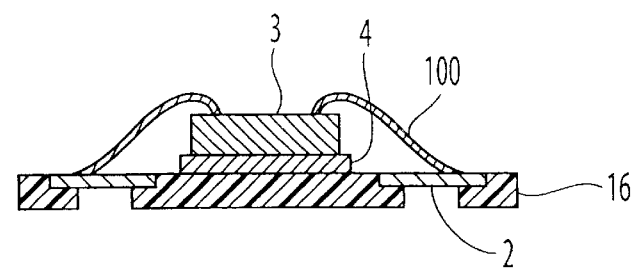
Figure 6E:
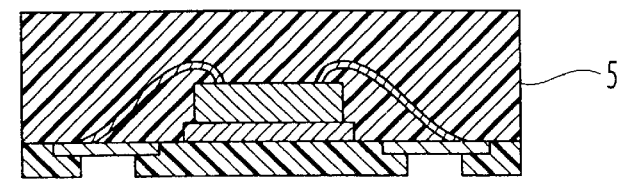
Figure 6F:
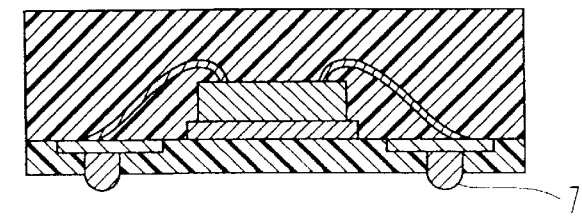

On an electrolytic copper foil 1 of 0.035 mm in thickness, a photosensitive dry film resist ("PHOTEC HN340", trade name; product of Hitachi Chemical Co., Ltd.) is laminated, exposed and then developed, so that a plating resist for wiring pattern is formed. Applied further are a gold plating of 99.9% or higher purity to a thickness of 0.0003 mm or greater and a nickel plating to a thickness of 0.003 mm or greater. Further, electrolytic copper plating is conducted in a copper sulfate bath, and the plating resist is stripped off, whereby a wiring 2 is formed (FIG. 6*a*). To the wiring-formed surface of the copper foil 1 on which the wiring 2 is formed as described above, a polyimide film 16 is bonded, connecting terminal portions of the wiring 2 are exposed by a laser (FIG. 6*b*), and the copper foil 1 is etched off (FIG. 6*c*). As an alternative, use of a photosensitive film in place of the polyimide film makes it possible to expose connecting terminal portions without using a laser. Subsequently, an LSI chip 3 is mounted on the surface of the polyimide film 16 on which the wiring pattern is formed. For bonding the LSI chip, a silver paste 4 for semiconductors was used. Next, semiconductor terminal portions and the wiring 2 are connected by wire bonds 100 (FIG. 6*d*). The thus-formed assembly is loaded in a die for transfer mold and sealed with a semiconductor-sealing epoxy resin ("CL-7700", trade name; product of Hitachi Chemical Co., Ltd.) 5 (FIG. 6*e*). Thereafter, solder balls 7 are arranged at the connecting terminal portions and are caused to fuse there (FIG. 6*f*). The wiring can be connected to an outer wiring via these solder balls 7.

With reference to FIG. 7, a description will be given of the seventh embodiment of the present invention.

Figure 7A:
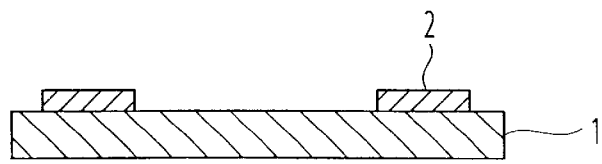
FIG. 7 is a cross-sectional view illustrating a process according to an embodiment of the present invention for the fabrication of a semiconductor package.
Figure 7B:
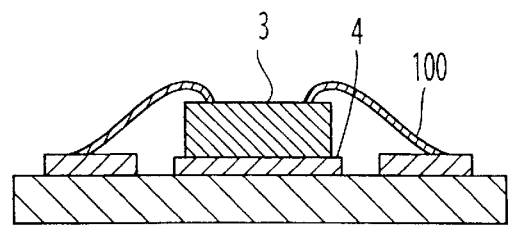
Figure 7C:
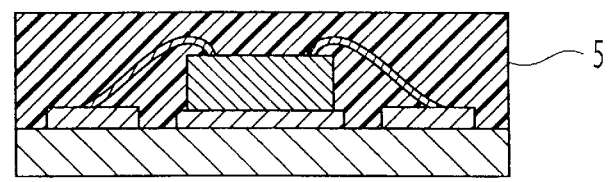
Figure 7D:
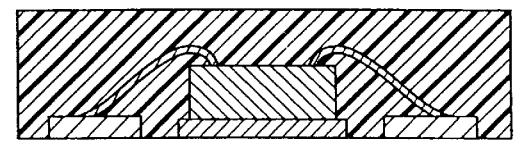
Figure 7E:
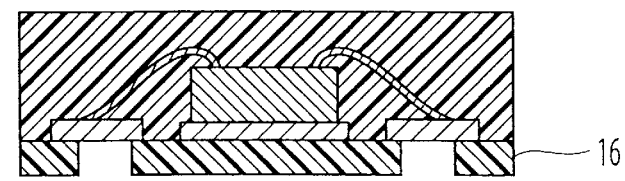
Figure 7F:
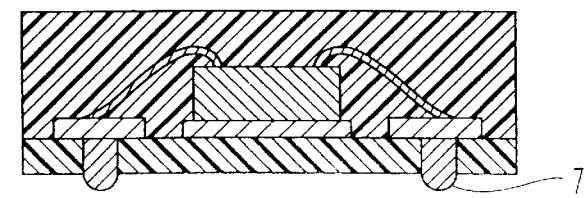

A nickel layer of 0.001 mm in thickness (not shown in FIG. 7) is plated on one side of an electrolytic copper foil 1 of 0.035 mm in thickness. Next, a photosensitive dry film resist ("PHOTEC HN340", trade name; product of Hitachi Chemical Co., Ltd.) is laminated, exposed and then developed, so that a plating resist for wiring pattern is formed. Subsequently, electrolytic copper plating is conducted in a copper sulfate bath. Applied further are a nickel plating to a thickness of 0.003 mm or greater and a gold plating of 99.9% or higher purity to a thickness of 0.0003 mm or greater. The plating resist is next stripped off, whereby a wiring 2 is formed (FIG. 7*a*). On the copper foil 1 with the wiring 2 formed thereon as described above, an LSI chip 3 is mounted. For bonding the LSI chip, a silver paste 4 for semiconductors was used. Next, semiconductor terminal portions and the wiring 2 are connected by wire bonds 100 (FIG. 7*b*). The thus-formed assembly is loaded in a die for transfer mold and sealed with a semiconductor-sealing epoxy resin ("CL-7700", trade name; product of Hitachi Chemical Co., Ltd.) 5 (FIG. 7*c*). Thereafter, only the copper foil 1 is dissolved away with an alkali etchant to expose the nickel. The nickel layer is removed with a nickel stripper having low copper-dissolving power so that the wiring portion is exposed (FIG. 7*d*). Then, a polyimide film 6 with openings made therein as connecting terminal portions is bonded (FIG. 7*e*). Solder balls 7 are arranged at the exposed portions of the wiring and are caused to fuse there (FIG. 7*f*). The wiring can be connected to an outer wiring via these solder balls 7.

With reference to FIG. 8, a description will be given of the eighth embodiment of the present invention.

Figure 8A:
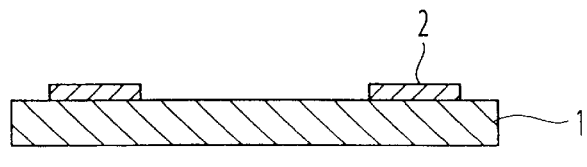
FIG. 8 is a cross-sectional view illustrating a process according to an embodiment of the present invention for the fabrication of a semiconductor package.
Figure 8B:
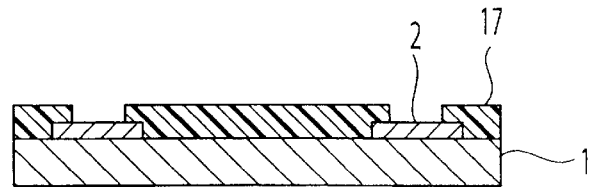
Figure 8C:
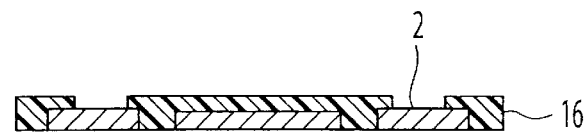
Figure 8D:
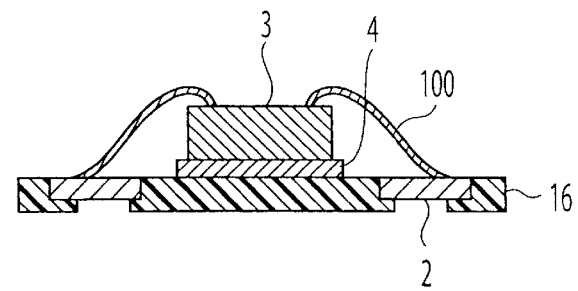
Figure 8E:
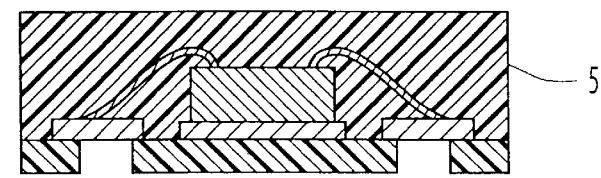
Figure 8F:
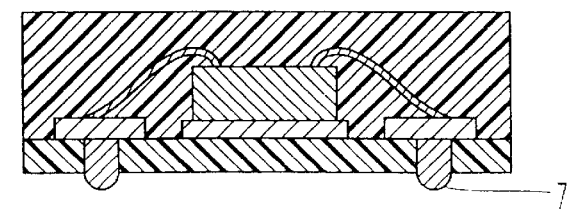

On an electrolytic copper foil 1 of 0.035 mm in thickness, a photosensitive dry film resist ("PHOTEC HN340", trade name; product of Hitachi Chemical Co., Ltd.) is laminated, exposed and then developed, so that a plating resist for wiring pattern is formed. Applied further are a gold plating of 99.9% or higher purity to a thickness of 0.0003 mm or greater and a nickel plating to a thickness of 0.003 mm or greater. Further, electrolytic copper plating is conducted in a copper sulfate bath, and the plating resist is stripped off, whereby a wiring 2 is formed (FIG. 8*a*). To the wiring-formed surface of the copper foil 1 on which the wiring pattern 2 is formed as described above, a liquid sealing resin 17 is coated by screen printing, and an insulating layer is formed in such a manner that connecting terminal portions of the wiring 2 are exposed (FIG. 8*b*). After curing the liquid sealing resin, the copper foil 1 is etched off (FIG. 8*c*). Subsequently, an LSI chip 3 is mounted on the surface of the hardened liquid sealing resin 3 in which the wiring pattern exist. For bonding the LSI chip, a silver paste 4 for semiconductors was used. Next, semiconductor terminal portions and the wiring 2 are connected by wire bonds 100 (FIG. 8*d*). The thus-formed assembly is loaded in a die for transfer mold and sealed with a semiconductor-sealing epoxy resin ("CL-7700", trade name; product of Hitachi Chemical Co., Ltd.) 5 (FIG. 8*e*). Thereafter, solder balls 7 are arranged at the connecting terminal portions of the wiring 2 and are caused to fuse there (FIG. 8*f*). The wiring can be connected to an outer wiring via these solder balls 7.

With reference to FIG. 9, a description will be given of the ninth embodiment of the present invention.

Figure 9A:
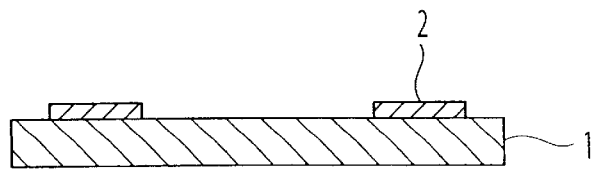
FIG. 9 is a cross-sectional view illustrating a process according to an embodiment of the present invention for the fabrication of a semiconductor package.
Figure 9B:
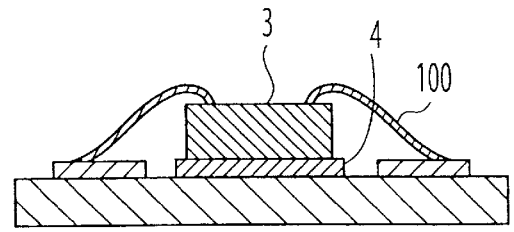
Figure 9C:
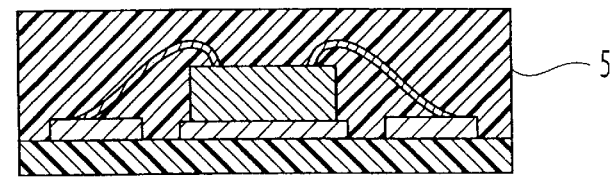
Figure 9D:
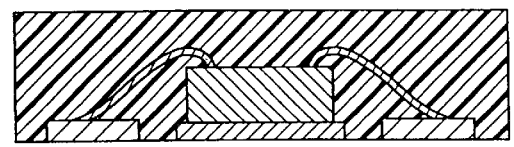
Figure 9E:
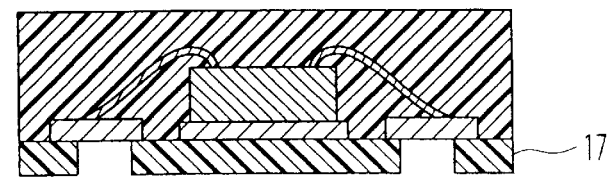
Figure 9F:
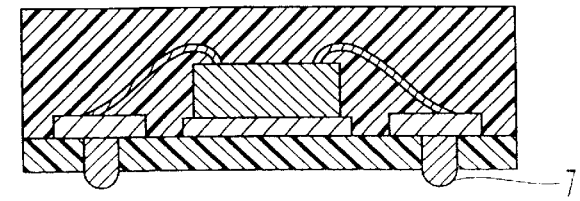

A nickel layer of 0.001 mm in thickness (not shown in FIG. 9) is plated on one side of an electrolytic copper foil 1 of 0.035 mm in thickness. Next, a photosensitive dry film resist ("PHOTEC HN340", trade name; product of Hitachi Chemical Co., Ltd.) is laminated, exposed and then developed, so that a plating resist for wiring pattern is formed. Subsequently, electrolytic copper plating is conducted in a copper sulfate bath. Applied further are a nickel plating to a thickness of 0.003 mm or greater and a gold plating of 99.9% or higher purity to a thickness of 0.0003 mm or greater. The plating resist is next stripped off, whereby a wiring 2 is formed (FIG. 9*a*). On the copper foil 1 with the wiring 2 formed thereon as described above, an LSI chip 3 is mounted. For bonding the LSI chip 3, a silver paste 4 for semiconductors was used. Next, semiconductor terminals and the wiring 2 are connected by wire bonds 100 (FIG. 9*b*). The thus-formed assembly is loaded in a die for transfer mold and sealed with a semiconductor-sealing epoxy resin ("CL-7700", trade name; product of Hitachi Chemical Co., Ltd.) 5 (FIG. 9*c*). Thereafter, only the copper foil 1 is dissolved away with an alkali etchant to expose the nickel. The nickel layer is removed with a nickel stripper having low copper-dissolving power so that the wiring portion is exposed (FIG. 9d). Then, a liquid sealing resin 17 is coated by screen printing, and an insulating layer of the liquid sealing resin 17 is formed in such a manner that connecting terminal portions of the wiring 2 are exposed (FIG. 9e). Solder balls 7 are arranged at the connecting terminal portions of the wiring 2 and are caused to fuse there (FIG. 9f). The wiring can be connected to an outer wiring via these solder balls 7.

With reference to FIG. 10, a description will be made about the tenth embodiment of the present invention.

Figure 10A:
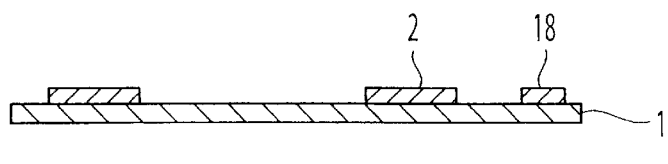
FIG. 10 is a cross-sectional view illustrating a process according to an embodiment of the present invention for the fabrication of a semiconductor package.
Figure 10B:
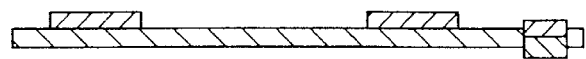
Figure 10C:
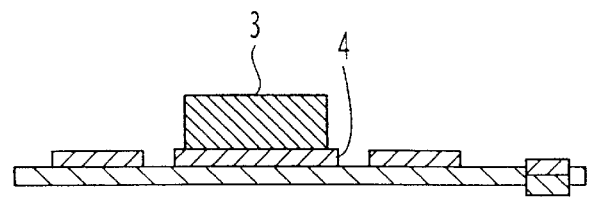
Figure 10D:
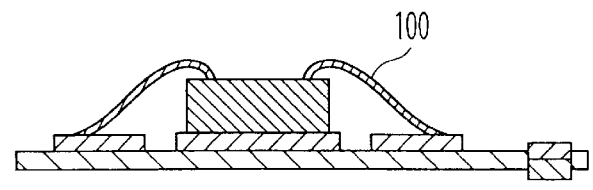
Figure 10E:
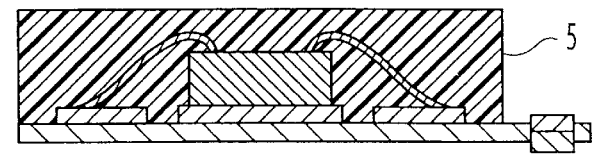
Figure 10F:
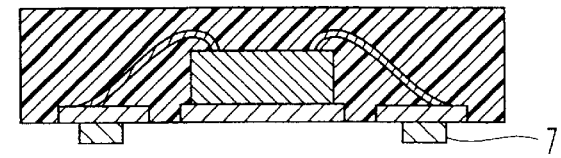
Figure 10G:
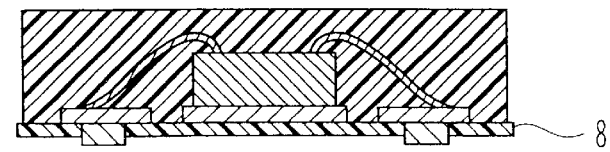

A nickel layer of 0.001 mm in thickness (not shown in FIG. 10) is plated on one side of an electrolytic copper foil 1 of 0.035 mm in thickness. Next, a photosensitive dry film resist ("PHOTEC HN340", trade name; product of Hitachi Chemical Co., Ltd.) is laminated, exposed and then developed, so that a plating resist for a wiring pattern and registration marks is formed. Subsequently, electrolytic copper plating is conducted in a copper sulfate bath. Applied further are a nickel plating to a thickness of 0.003 mm or greater and a gold plating of 99.9% or higher purity to a thickness of 0.0003 mm or greater. The plating resist is next stripped off, whereby a wiring 2 and registration marks 18 are formed (FIG. 10a). Only portions with the registration marks 18 formed thereon are held between SUS sheets and then pressed, whereby the registration marks are caused to appear on the back side of the copper foil 1 as if they are die-stamped (FIG. 10b). On the copper foil 1 with the wiring 2 and the registration mark 18 formed thereon as described above, an LSI chip 3 is mounted (FIG. 10c). For bonding the LSI chip 3, a silver paste 4 for semiconductors was used. Next, semiconductor terminals and the wiring 2 are connected by wire bonds 100 (FIG. 10d). The thus-formed assembly is loaded in a die for transfer mold and sealed with a semiconductor-sealing epoxy resin ("CL-7700", trade name; product of Hitachi Chemical Co., Ltd.) 5 (FIG. 10e). A photosensitive dry film is again laminated on the back side of the copper foil, and an etching pattern is formed by using the registration marks 18. Thereafter, the copper foil 1 and the nickel layer are etched to form the copper foil 1 into bumps 7 and to expose the wiring portion (FIG. 10f). Subsequently, a solder resist 8 was coated, and an insulating layer was formed in such a way that the bumps 7 were exposed (FIG. 10g). The wiring pattern can be connected to outer wiring via these bumps 7.

With reference to FIG. 11, a description will be given of the eleventh embodiment of the present invention.

On an electrolytic copper foil 1 of 0.035 mm in thickness, a photosensitive dry film resist ("PHOTEC HN340", trade name; product of Hitachi Chemical Co., Ltd.) is laminated, exposed and then developed, so that a plating resist for plural sets of wiring patterns is formed. Applied further are a gold plating of 99.9% or higher purity to a thickness of 0.0003 mm or greater and a nickel plating to a thickness of 0.003 mm or greater. Further, electrolytic copper plating is conducted in a copper sulfate bath, and the plating resist is stripped off, whereby plural sets of wiring 2 are formed (FIG. 11a). To the pattern-formed surface of the copper foil 1 with the plural sets of wiring 2 formed thereon as described above, a polyimide film 19 is bonded, connecting terminal portions of the wiring 2 are exposed by a laser (FIG. 11b), and the copper foil 1 is etched off (FIG. 11c). After the plural sets of wiring 2 are formed on the single polyimide film as described above, LSI chips 3 are mounted. For bonding the LSI chips, die-bonding tapes 4' for semiconductors were used. Next, semiconductor terminal portions and the wiring 2 are connected by wire bonds 100 (FIG. 11d). The thus-formed assembly is loaded in a die for transfer mold and sealed with a semiconductor-sealing epoxy resin ("CL-7700", trade name; product of Hitachi Chemical Co., Ltd.) 5 (FIG. 11e). Thereafter, solder balls 7 are arranged at the connecting terminal portions of the wiring 2 and are caused to fuse there (FIG. 11f). The wiring can be connected to outer wiring via these solder balls 7, respectively. Finally, the packages connected together with the polyimide film are punched out by dies (FIG. 11g).

With reference to FIG. 12, a description will be given of the twelfth embodiment of the present invention.

Figure 12A:
FIG. 12 is a cross-sectional view illustrating a process according to an embodiment of the present invention for the fabrication of a semiconductor package.
Figure 12B:
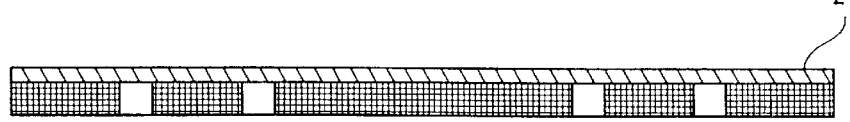
Figure 12C:
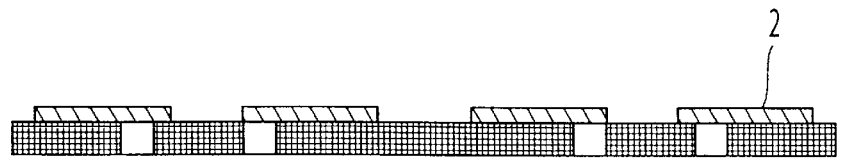
Figure 12D:
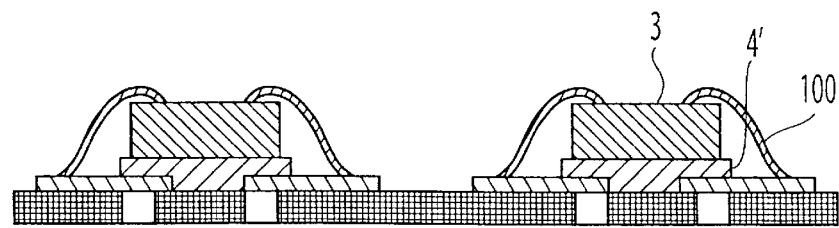
Figure 12E:
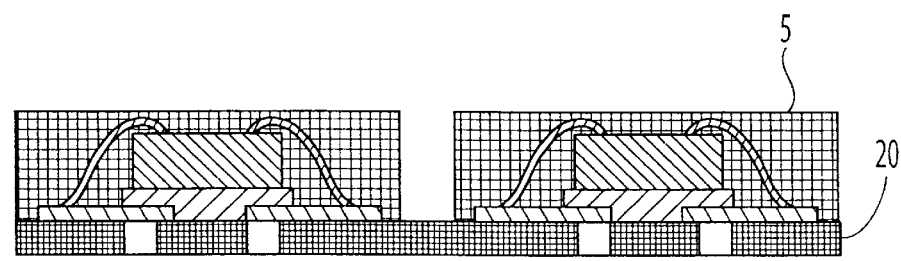
Figure 12F:
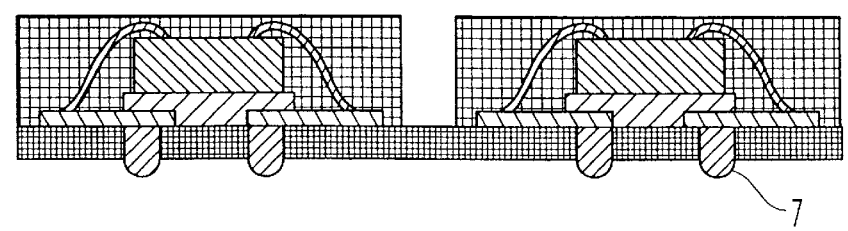
Figure 12G:
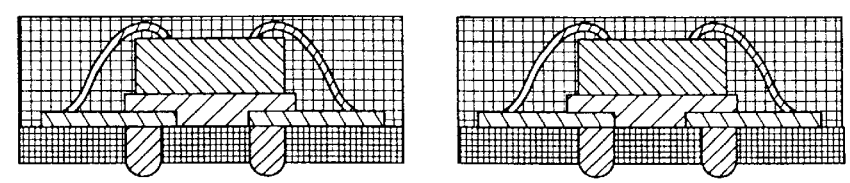

An adhesive-coated polyimide film 20 of 0.07 mm in thickness is punched by dies to form openings at portions where connecting terminals are to be formed (FIG. 12a). After bonding a copper foil 21 of 0.035 mm in thickness (FIG. 12b), a photosensitive dry film resist ("PHOTEC HN340", trade name; product of Hitachi Chemical Co., Ltd.) is laminated, exposed and then developed, so that an etching resist for plural sets of wiring patterns is formed. Subsequently, the copper foil is etched and the resist is stripped off, then plural sets of wiring patterns 2 is formed (FIG. 12c). After the plural sets of wiring patterns are formed on the single polyimide film as described above, LSI chips 3 are mounted. For bonding the LSI chips 3, die-bonding tapes 4' for semiconductors were used. Next, semiconductor terminal portions and the wiring 2 are connected by wire bonds 100 (FIG. 12d). The thus-formed assembly is loaded in a die for transfer mold and sealed with a semiconductor-sealing epoxy resin ("CL-7700", trade name; product of Hitachi Chemical Co., Ltd.) 5 (FIG. 12e). Thereafter, solder balls 7 are arranged at the connecting terminal portions of the wiring and are caused to fuse there (FIG. 12f). The wiring can be connected to outer wiring via these solder balls 7. Finally, the packages connected together with the polyimide film are punched out by dies (FIG. 12g).

Figure 13A:
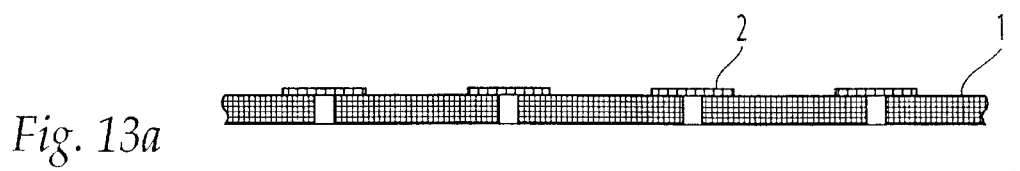
FIG. 13 is a cross-sectional view illustrating a process according to an embodiment of the present invention for the fabrication of a semiconductor package.
Figure 13B:
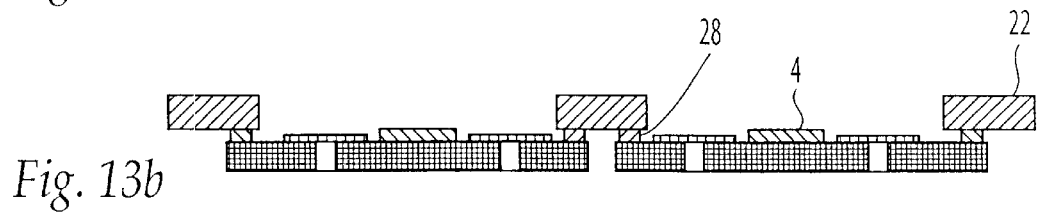
Figure 13C:
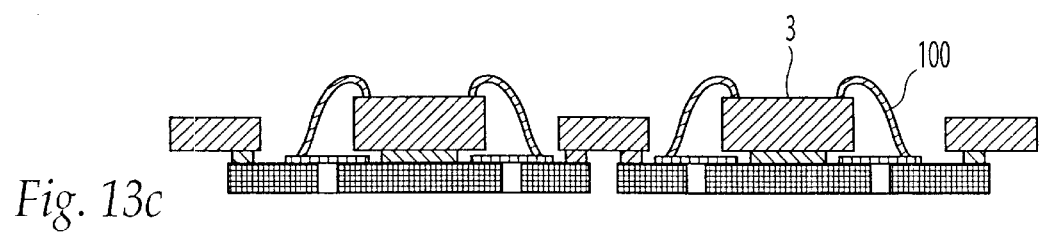
Figure 13D:
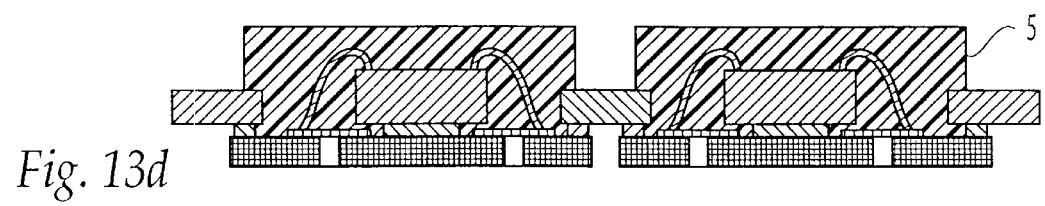
Figure 13E:
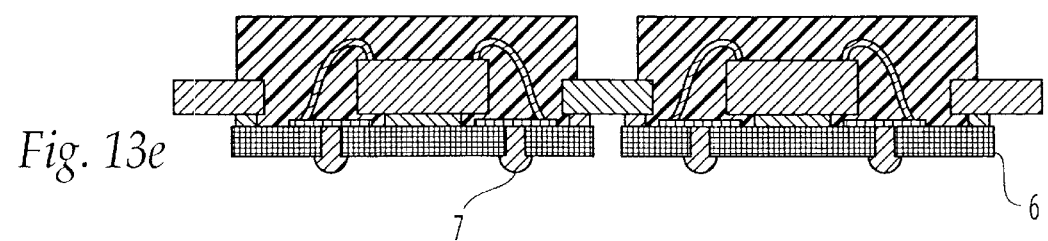
Figure 13F:
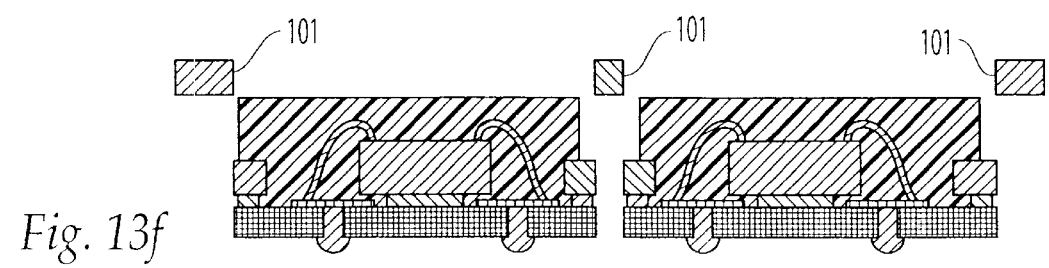
Figure 14:
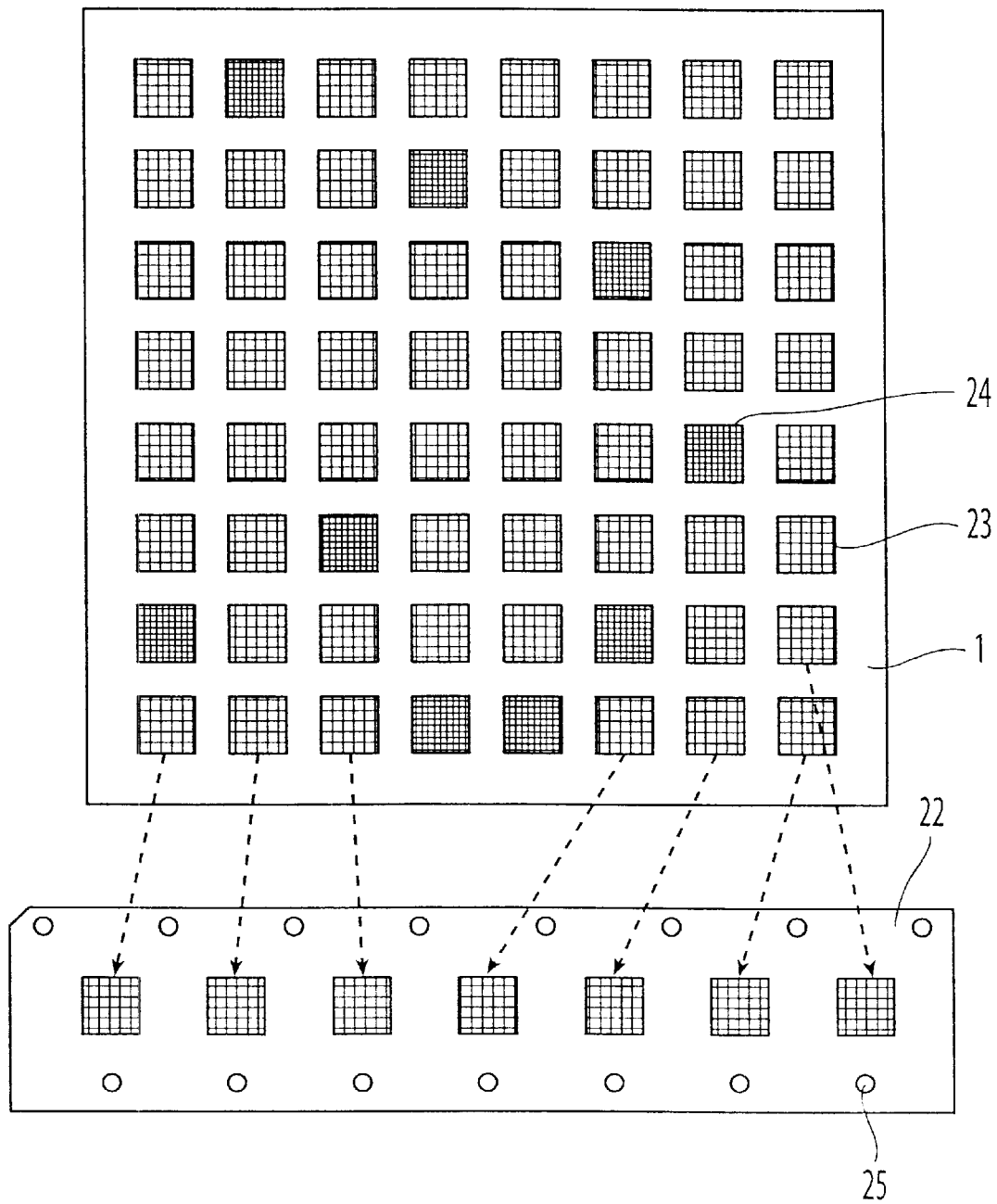
FIG. 14 is a plan view illustrating the process according to an embodiment of the present invention for the fabrication of the semiconductor package.

With reference to FIGS. 13 to 15, a description will be given of the thirteenth embodiment of the present invention.

Figure 15A:
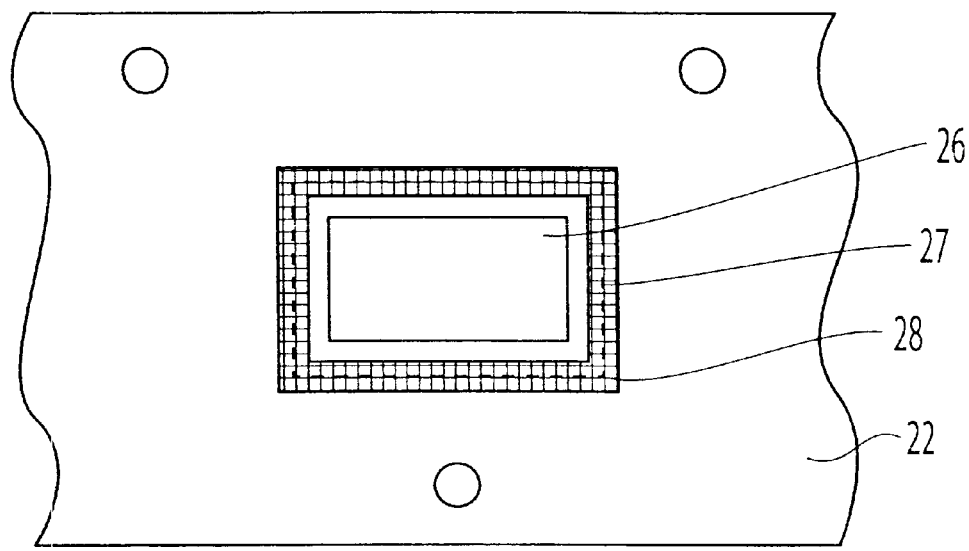
FIG. 15 is a plan view illustrating the process according to an embodiment of the present invention for the fabrication of the semiconductor package.
Figure 15B:
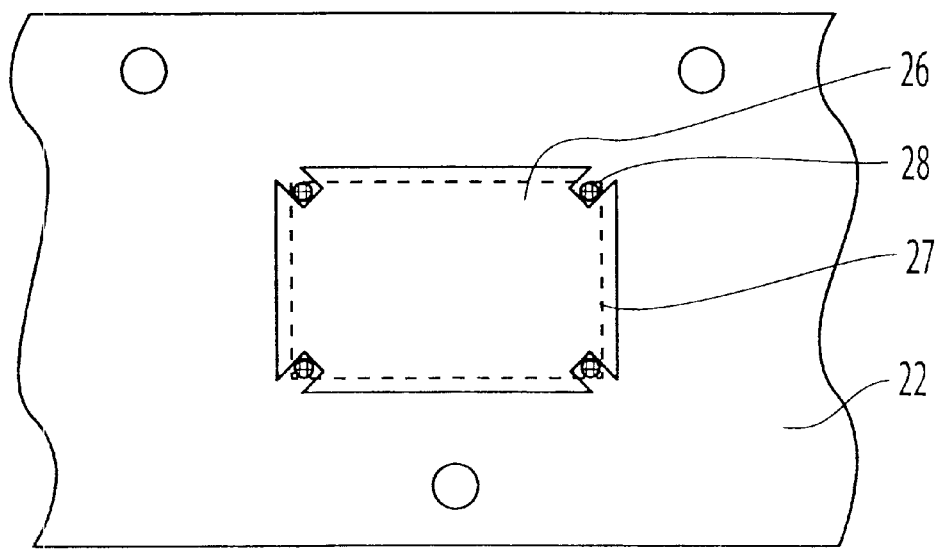

A nickel layer of 0.001 mm in thickness (not shown in FIG. 13) is plated on one side of an electrolytic copper foil 1 of 0.035 mm in thickness. Next, a photosensitive dry film resist ("PHOTEC HN340", trade name; product of Hitachi Chemical Co., Ltd.) is laminated, exposed and then developed, so that a plating resist for plural sets of wiring patterns is formed. Subsequently, electrolytic copper plating is conducted in a copper sulfate bath. Applied further are a nickel plating to a thickness of 0.003 mm or greater and a gold plating of 99.9% or higher purity to a thickness of 0.0003 mm or greater. The plating resist is stripped off, whereby wiring 2 are formed (FIG. 13a). Next, the copper foil 1 with the wiring 2 formed thereon are divided into individual units and bonded to a separately-prepared stainless steel frame 22 (thickness: 0.135 mm) via a polyimide adhesive film (FIG. 13b). For the frame, a copper alloy such as phosphor bronze, a copper foil, a nickel foil, a nickel alloy foil or the like can also be used. As an alternative bonding method, it is possible to use inter alia bonding making use of an intermetallic eutectic reaction or bonding making use of an ultrasonic wave. Further, as is depicted in FIG. 14, it is desired to inspect the wiring on the copper foil 1 beforehand, to select only connection non-defectives 23 and then to bond the thus-selected connection non-defectives to the frame 22. In FIG. 14, there are shown the electrolytic copper foil 1, the frame 22, connection defectives 24, and registration holes 25. Although each cut-off copper foil is provided with one wiring in this embodiment, plural sets of wiring may be arranged on each cut-off copper foil. As a positional relationship between the frame 22 and each copper foil upon bonding them together, various positional relationships are feasible as shown by way of example in FIGS. 15(a) and 15(b). FIG. 15 shows the frame 22 in plan view, in which there are illustrated an opening 26 in the frame, a mounting position 27 for the copper foil with the wiring, and a foil-fixing adhesive 28. Next, LSI chips 3 are mounted, and semiconductor terminal portions and their corresponding wiring 2 are connected by wire bonds 100 (FIG. 13c). For mounting the LSI chips, die-bonding tapes 4' for semiconductors are used. Here, die-bonding silver paste or the like can be used instead of the bonding tapes 4'. For the mounting of semiconductor chips, a conventional wire-bonding method was used. Other methods such as Flip chips may also be used. The thus-formed assembly was loaded in a die for transfer mold and sealed with a semiconductor-sealing epoxy resin ("CL-7700", trade name; product of Hitachi Chemical Co., Ltd.) 5 (FIG. 13d). Thereafter, only the copper foil 1 was dissolved away with an alkali etchant to expose the nickel. The nickel layer was removed with a nickel stripper having low copper-dissolving power so that the wiring portions were exposed. Then, a solder resist 6 was coated and patterned in such a way that connecting terminal portions were exposed. Solder balls 7 were arranged at the exposed portions of the wiring and were caused to fuse there (FIG. 13e). The thus-obtained assembly was cut apart by a cutter and unnecessary cut pieces 101 of the frame 22 were eliminated, so that the assembly was divided into individual semiconductor packages (FIG. 13f). Each wiring can be connected to an outer wiring via its corresponding solder balls 7. This embodiment makes it possible to improve the blanking and hence to efficiently fabricate semiconductor packages.

With reference to FIG. 16, a description will be made about the fourteenth embodiment of the present invention.

Figure 16A:
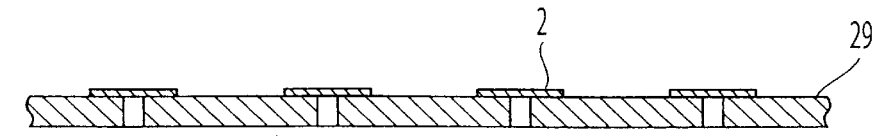
FIG. 16 is a cross-sectional view illustrating a process according to an embodiment of the present invention for the fabrication of a semiconductor package.

An adhesive-coated polyimide film 29 of 0.07 mm in thickness is punched by dies to form openings at portions where connecting terminal portions are to be formed. After bonding it to a copper foil of 0.035 mm in thickness, a photosensitive dry film resist ("PHOTEC HN340", trade name; product of Hitachi Chemical Co., Ltd.) was laminated, exposed and then developed, so that an etching resist for plural sets of wiring patterns was formed. Subsequently, the copper foil is etched and the resist is stripped off, whereby plural sets of wiring 2 are formed (FIG. 16a). Here, the connecting terminal portions and the wiring 2 can be formed using a material which is formed of a copper foil and a polyimide coated directly on the copper foil (for example, "50001", trade name; product of Hitachi Chemical Co., Ltd.). The formation of the openings can be effected by drilling, laser beam machining such as excimer laser machining, printing or the like. As a further alternative, they can also be formed by using a material, which has been obtained by imparting photosensitivity to a polyimide, and conducting exposure and development. Instead of the polyimide, another material such as a sealing resin can also be used.

Figure 16B:
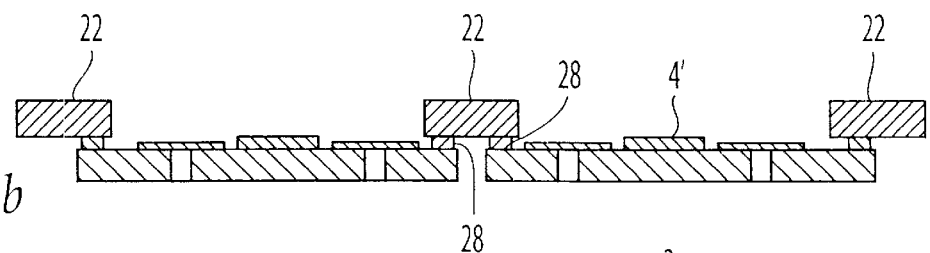
Figure 16C:
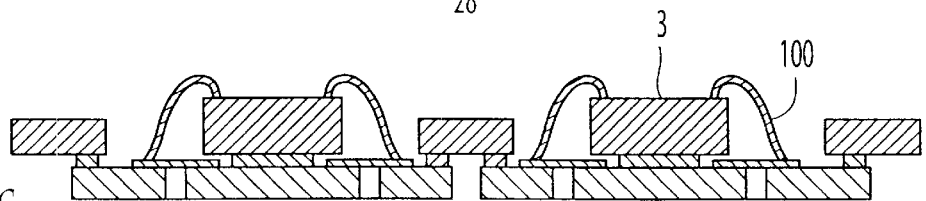
Figure 16D:
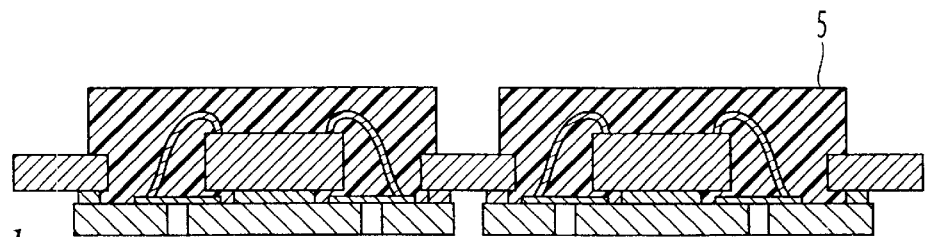
Figure 16E:
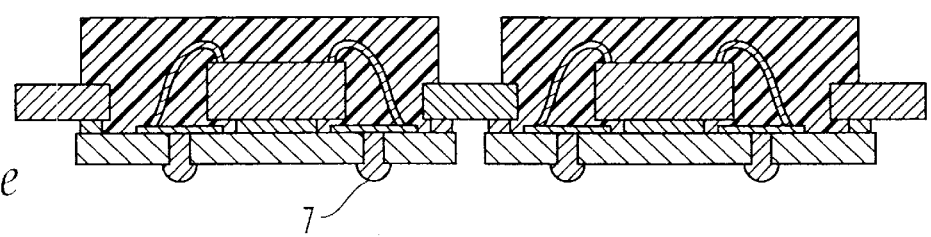
Figure 16F:
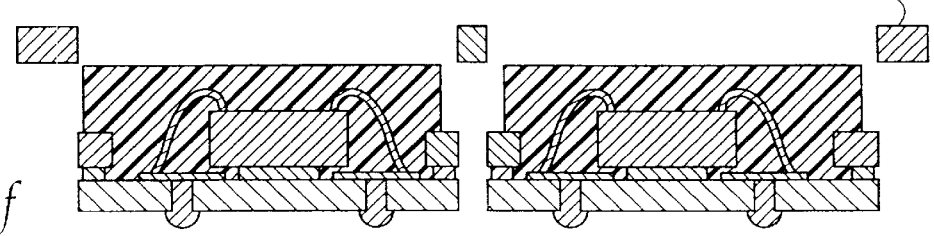

After forming the plural sets of wiring on the single polyimide film as described above, the wiring-formed film was divided into units. They were then bonded to a separately-prepared stainless steel frame 22 (thickness: 0.135 mm) via a polyimide adhesive 28 (FIG. 16b). Then, LSI chips 3 were mounted, and semiconductor terminal portions and the corresponding wiring 2 are connected by wire bonds 100 (FIG. 16c). For the mounting of the LSI chips, die-bonding tapes 4' for semiconductors were used. The thus-formed assembly was loaded in a die for transfer mold and sealed with a semiconductor-sealing epoxy resin ("CL-7700", trade name; product of Hitachi Chemical Co., Ltd.) 5 (FIG. 16d). Subsequently, solder balls 7 are arranged in the openings, which were formed in the beginning and are to be converted to connecting terminal portions, and are caused to fuse there (FIG. 16e). The wiring can be connected to outer wiring via these solder balls 7, respectively. Finally, the packages connected together with the frame are punched out by dies into individual packages (FIG. 16f).

With reference to FIG. 17, a description will be given of the fifteenth embodiment of the present invention.

A two-layer flexible base material is composed of a metal foil 31 and an insulating base material 32 formed directly thereon (FIG. 17a). A predetermined resist pattern is formed on the metal foil. By a known etching process, desired plural sets of wiring patterns 33 are formed, and the resist pattern is then stripped off (FIG. 17b). As the metal foil, a composite metal foil, which has a thin copper layer on a carrier foil removable in a subsequent step, or the like can also be used besides a single foil such as an electrolytic copper foil, a rolled copper foil or a copper alloy foil. Specifically, a metal foil—which is obtained by forming a nickel-phosphorus plating layer of 0.2 $\mu$m or so in thickness on one side of an electrolytic copper foil of 18 $\mu$m in thickness and then plating a thin copper layer to a thickness of 5 $\mu$m or so—is applicable. In this case, the thin copper layer is exposed by etching off the copper foil and nickel-phosphorus layer subsequent to formation of a polyimide layer on the thin copper layer. Namely, in the present invention, the thin copper layer may be patterned after the thin copper layer is exposed in its entirety, or the carrier foil (copper foil/thin nickel layer) may be used as a part of a leadframe structure.

As the insulating base material, on the other hand, a polyimide material is ordinary from the viewpoint of process heat resistance and the like. In this case, it is preferred to use, as the polyimide, a polyimide containing 70 mole % or more of a polyimide having repeating units represented by the following formula (1) because a marked warp would be developed in the base material in a solder reflowing step if the polyimide and the copper foil had different coefficients of thermal expansion:

Formula (1)

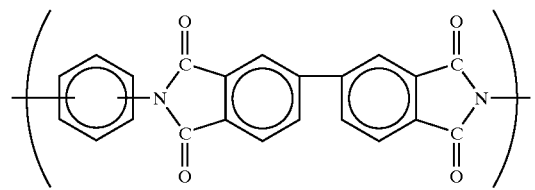

Next, holes 34 reaching the copper foil are formed at positions which are to be converted to connecting portions to an external substrate in a subsequent step (FIG. 17c). No particular limitation is imposed on the method for the formation of the holes. In addition to a laser beam machining making use of an excimer laser, $CO_2$ laser or YAG laser, a wet etching process and so on is applicable.

A frame base material 37, which is coated with an adhesive 36 and has been punched out at predetermined portions (openings 35) by punching or the like, is then bonded to surfaces of the wiring patterns (FIG. 17d). In this case, no particular limitation is imposed on the frame base material and a polyimide film or a metal foil such as a copper foil is applicable. If the thickness of the polyimide layer of the two-layer flexible base material is 25 $\mu$m and the bonded frame base material is a polyimide film, a film thickness as much as 50 to 70 µm is required to assure sufficient rigidity for the whole frame. Incidentally, no particular limitation is imposed on the area where the frame base material layer is formed. It is also possible to arrange the frame base material layer in areas where semiconductor chips are to be mounted. Specifically, where the mounting of chips is effected by the wire-bonding method, the frame base material layer may be arranged in the entire area insofar as at least terminal portions 38 are exposed for wire-bonding. Semiconductor chips 39 are then mounted, and the semiconductor chips and the wiring patterns are electrically connected together by gold wires 40 (FIG. 17e). Where a face-down method is adopted as a mounting method for semiconductor chips, on the other hand, the wiring patterns are provided with metal bumps or the like at predetermined positions (which correspond to the positions of external connection electrodes of the semiconductor chips), and the semiconductor chips and the wiring patterns may be electrically connected together via the-metal bumps. The thus-obtained assembly is then loaded in a die for transfer mold and is sealed with a resinous sealing material 41 (FIG. 17f). In this case, no particular limitation is imposed on the resinous sealing material and, for example, an epoxy resin containing 5 to 80 wt. % of silica of about 10 to 20 µm in diameter can be used. Formed next are connecting portions 42 which are to be used for establishing connection with external substrates. As a method for the formation of the connecting portions 42, it is possible to apply a method such that bumps are formed beforehand to a thickness greater than the polyimide film by an electrolytic plating process after the step of FIG. 17c or solder bumps are formed by a solder printing process after sealing with the resin. Finally, the package portions are cut off from the frame so that packages are obtained as desired (FIG. 17g).

The fifteenth embodiment of FIG. 17 will be described more specifically.

SPECIFIC EXAMPLE 1

A two-layer flexible base material having an electrolytic copper foil of 12 µm in thickness on one side thereof ("MCF 50001", trade name; product of Hitachi Chemical Co., Ltd.) was provided. A dry film resist ("PHOTEC HK815", trade name; product of Hitachi Chemical Co., Ltd.) was laminated on the copper foil and then exposed and developed, whereby a desired resist pattern was obtained. After the copper foil was etched with a solution of ferric chloride, the resist pattern was stripped with a solution of potassium hydroxide so that a predetermined wiring pattern was obtained. Using an excimer laser beam machine ("INDEX 200", trade name; manufactured by Sumitomo Heavy Industries, Ltd.), as many holes as needed (diameter: 300 µm) were formed at predetermined positions so that they extend from a side of an insulating base material and reach a back surface of the wiring pattern. The following conditions were set for the excimer laser beam machining—energy density: 250 mJ/cm$^2$, reduction ratio: 3.0, oscillation frequency: 200 Hz, and illumination pulse number: 300 pulses. Prepared next was an adhesive sheet having a 10-µm thick polyimide-base adhesive ("AS 2250", trade name; product of Hitachi Chemical Co., Ltd.) on one side of a 50-µm thick polyimide film ("UPILEX S", trade name; product of Ube Industries, Ltd.). Predetermined areas including those corresponding to terminal portions to be used for wire bonding in a subsequent step were removed by punching, and the polyimide film and the two-layer flexible base material with the wiring pattern formed thereon were subjected to thermocompression via the adhesive. The following conditions were set for the thermo compression bonding—pressure: 20 kgf/cm$^2$, temperature: 180° C., and thermocompression time: 60 minutes. By electroless nickel and gold plating processes, the terminal portions for the wire bonding were next applied with nickel/gold platings. The thicknesses of these platings were 3 µm and 0.3 µm, respectively. Using a semiconductor-chip-mounting die-bonding material ("HM-1", trade name; product of Hitachi Chemical Co., Ltd.), semiconductor chips were then mounted. The mounting conditions were set as follows—press pressure: 5 kgf/cm$^2$, bonding temperature: 380° C., and compression-bonding time: 5 seconds. External electrode portions of each semiconductor chip were then electrically connected with its corresponding wiring pattern by wire bonding. The thus-obtained assembly was stamped into a leadframe-shaped form, loaded in a die for transfer mold and then sealed at 185° C. for 90 seconds with a semiconductor-sealing epoxy resin ("CL-7700", trade name; product of Hitachi Chemical Co., Ltd.). The above-mentioned holes were then each coated with a predetermined amount of solder by a printing process. The solder was caused to fuse in an infrared reflowing oven, so that external connection bumps were formed. Finally, the package portions were punched out by dies so that packages were obtained as desired.

With reference to FIG. 18, a description will be made of the sixteenth embodiment of the present invention.

A two-layer flexible base material is composed of a metal foil 31 and an insulating base material 32 formed directly thereon (FIG. 18a). A predetermined resist pattern is formed on the metal foil. By a known etching process, desired plural sets of wiring patterns 3 are formed, and the resist pattern is then stripped off (FIG. 18b). As the metal foil, a composite metal foil, which has a thin copper layer on a carrier foil removable in a subsequent step, or the like can also be used besides a single foil such as an electrolytic copper foil, a rolled copper foil or a copper alloy foil. Specifically, a metal foil—which is obtained by forming a nickel-phosphorus plating layer of 0.2 µm or so in thickness on one side of an electrolytic copper foil of 18 µm in thickness and then plating a thin copper layer to a thickness of 5 µm or so—is applicable. In this case, the thin copper layer is exposed by etching off the copper foil and nickel-phosphorus layer subsequent to formation of a polyimide layer on the thin copper layer. Namely, in the present invention, the thin copper layer may be patterned after the thin copper layer is exposed in its entirety, or the carrier foil (copper foil/thin nickel layer) may be used as a part of a leadframe structure. As the insulating base material, on the other hand, a polyimide material is ordinary from the viewpoint of process heat resistance and the like. In this case, it is preferred to use, as the polyimide, a polyimide containing 70 mole % or more of a polyimide having repeating units represented by the formula (1) because a marked warp will be developed in the base material in a solder reflowing step if the polyimide and the copper foil have different coefficients of thermal expansion.

Next, holes 34 reaching the copper foil are formed at positions which are to be converted to connecting portions to external substrate in a subsequent step (FIG. 18c). No particular limitation is imposed on the method for the formation of the holes. In addition to a laser beam machining making use of an excimer laser, $CO_2$ laser, or YAG laser, a wet etching process or the like is applicable.

A frame base material 37, which is coated with an adhesive 36 and has been punched out at predetermined portions (openings 5) by punching or the like, is then bonded as a second insulating base material to surfaces of the wiring patterns (FIG. 18d). If the thickness of the polyimide layer of the two-layer flexible base material is 25 µm, a film thickness as much as 50 to 70 µm is required as a thickness of a polyimide film to be bonded in view of a subsequent step in which the polyimide film is fixed on a frame. Incidentally, no particular limitation is imposed on the area where the polyimide is bonded. Its arrangement in areas where semiconductor chips are to be mounted makes it possible to form external connection terminals under the semiconductor chips like CSPs. Specifically, where the mounting of chips is effected by the wire-bonding method, the polyimide film may be bonded in the entire area insofar as at least terminal portions 38 are exposed for wire-bonding. The insulating substrate obtained as described above is divided into the individual wiring patterns (FIG. 18e) and are then fixed on a separately-prepared frame 43 made, for example, of SUS or the like (FIG. 18f). Semiconductor chips 39 are then mounted, and the semiconductor chips and the wiring patterns are electrically connected together by gold wires 40 (FIG. 18g). Where a face-down method is adopted as a mounting method of semiconductor chips, on the other hand, the wiring patterns are provided with metal bumps or the like at predetermined positions (which correspond to the positions of external connection electrodes of the semiconductor chips), and the semiconductor chips and the wiring patterns may be electrically connected together via the metal bumps. The thus-obtained assembly is then loaded in a die for transfer mold and is sealed with a resinous sealing material 41 (FIG. 18h). In this case, no particular limitation is imposed on the resinous sealing material and, for example, an epoxy resin containing 5 to 80 wt. % of silica of about 10 to 20 µm in diameter can be used. Formed next are connecting portions 12 which are to be used for establishing connection with external substrates. As a method for the formation of the connecting portions 12, it is possible to apply a method such that bumps are formed beforehand to a thickness greater than the polyimide film by an electrolytic plating process after the step of FIG. 18c or solder bumps are formed by a solder printing process after sealing with the resin. Finally, the package portions are cut off from the frame so that packages are obtained as desired (FIG. 18i).

The sixteenth embodiment of FIG. 18 will be described more specifically.

SPECIFIC EXAMPLE 2

A two-layer flexible base material having an electrolytic copper foil of 12 µm in thickness on one side thereof ("MCF 50001", trade name; product of Hitachi Chemical Co., Ltd.) was provided. A dry film resist ("PHOTEC HK815", trade name; product of Hitachi Chemical Co., Ltd.) was laminated on the copper foil and then exposed and developed, whereby a desired resist pattern was obtained. After the copper foil was etched with a solution of ferric chloride, the resist pattern was stripped with a solution of potassium hydroxide so that a predetermined wiring pattern was obtained. Using an excimer laser beam machine ("INDEX 200", trade name; manufactured by Sumitomo Heavy Industries, Ltd.), as many holes as needed (diameter: 300 µm) were formed as many as needed at predetermined positions so that they extend from a side of an insulating base material and reach a back surface of the wiring pattern. The following conditions were set for the excimer laser beam machining— energy density: 250 mJ/cm², reduction ratio: 3.0, oscillation frequency: 200 Hz, and illumination pulse number: 300 pulses. Prepared next was an adhesive sheet having a 10-µm thick polyimide-base adhesive ("AS 2250", trade name; product of Hitachi Chemical Co., Ltd.) on one side of a 50-µm thick polyimide film ("UPILEX S", trade name; product of Ube Industries, Ltd.). Predetermined areas including those corresponding to terminal portions to be used for wire bonding in a subsequent step were removed by punching, and the polyimide film and the two-layer flexible base material with the wiring pattern formed thereon were subjected to thermocompression via the adhesive. The following conditions were set for the thermo compression bonding—pressure: 20 kgf/cm², temperature: 180° C., and thermocompression time: 60 minutes. By electroless nickel and gold plating processes, the terminal portions for the wire bonding were next applied with nickel/gold platings. The thicknesses of these platings were 3 µm and 0.3 µm, respectively. The thus-obtained substrate was divided into the individual wiring patterns and are fixed on a separately-prepared SUS frame. Using a semiconductor-chip-mounting die-bonding material ("HM-1", trade name; product of Hitachi Chemical Co., Ltd.), semiconductor chips were then mounted. The mounting conditions were set as follows— press pressure: 5 kgf/cm², bonding temperature: 380° C., and compression-bonding time: 5 seconds. External electrode portions of each semiconductor chip were then electrically connected with its corresponding wiring pattern by wire bonding. The thus-obtained assembly was molded into a leadframe-shaped form, loaded in a die for transfer mold and then sealed at 185° C. for 90 seconds with a semiconductor-sealing epoxy resin ("CL-7700", trade name; product of Hitachi Chemical Co., Ltd.). The above-mentioned holes were then each coated with a predetermined amount of solder by a printing process. The solder was caused to fuse in an infrared reflowing oven, so that external connection bumps were formed. Finally, the package portions were punched out by dies so that packages were obtained as desired.

Figure 19A:
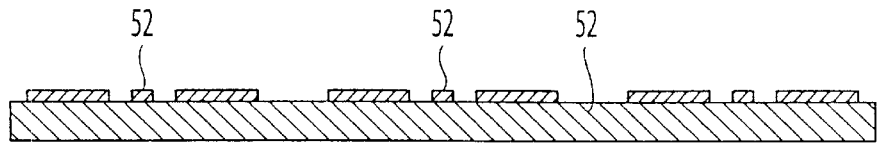
FIG. 19 is a cross-sectional view illustrating a process according to an embodiment of the present invention for the fabrication of a semiconductor package.
Figure 19B:
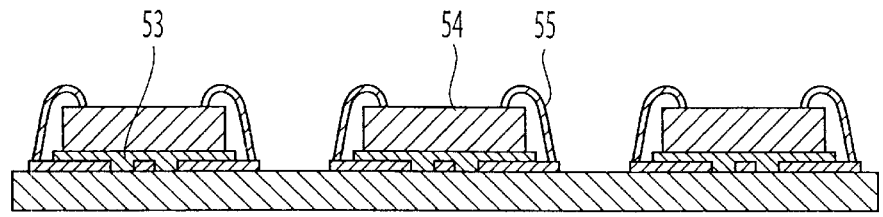
Figure 19C:
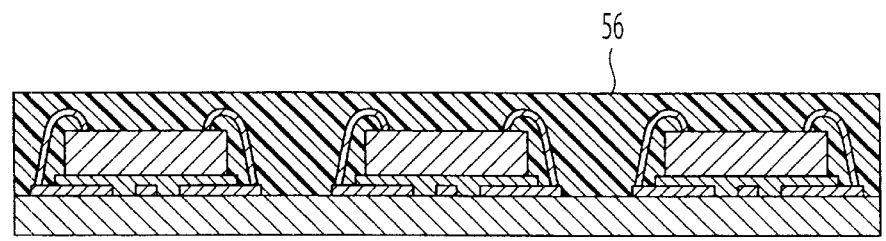
Figure 19D:
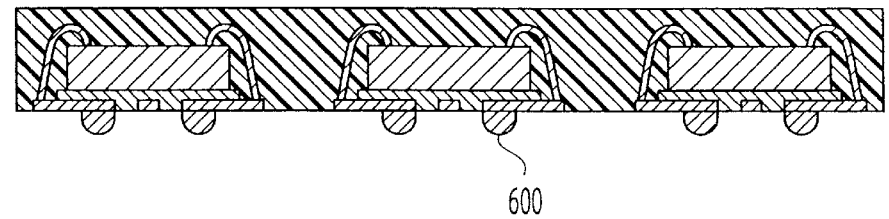
Figure 19E:
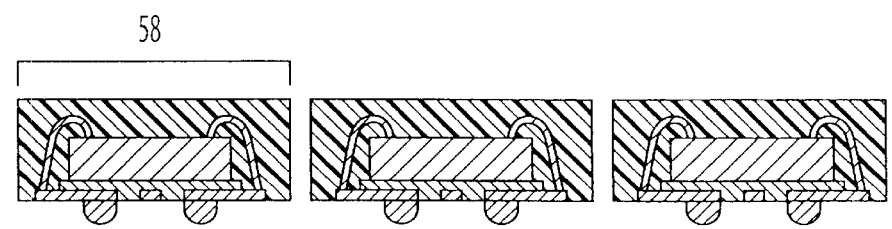
Figure 20:
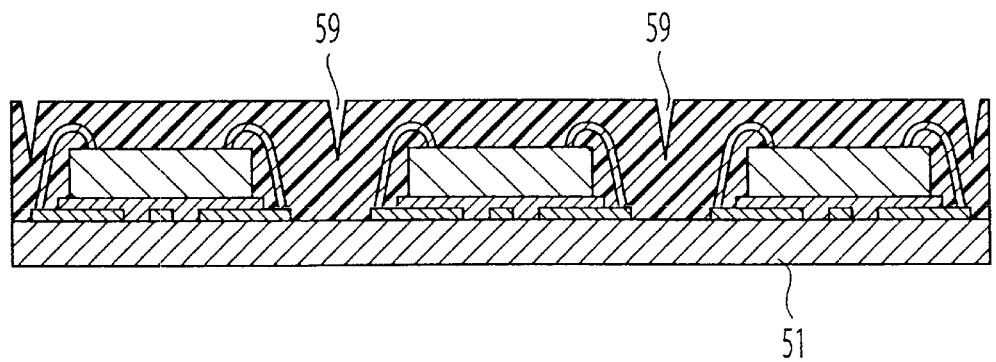
FIG. 20 is a cross-sectional view illustrating the process according to an embodiment of the present invention for the fabrication of the semiconductor package.
Figure 21:
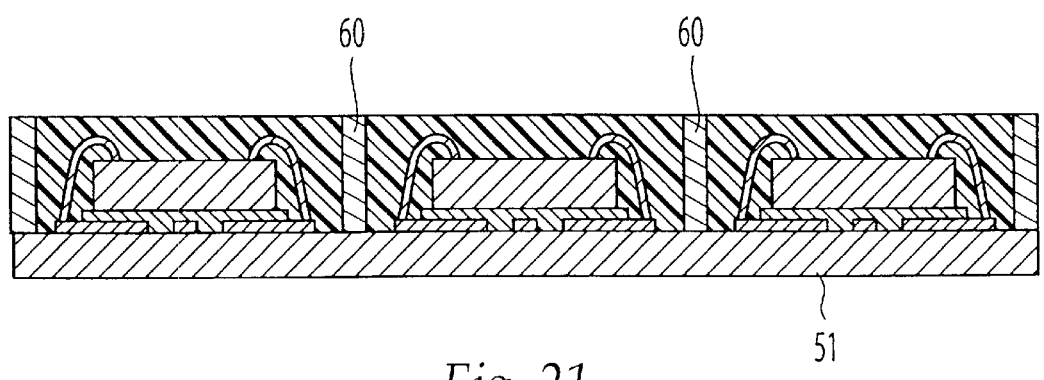
FIG. 21 is a cross-sectional view illustrating the process according to an embodiment of the present invention for the fabrication of the semiconductor package.

With reference to FIGS. 19, 20 and 21, a description will be given of the seventeenth embodiment of the present invention.

Plural sets of predetermined wiring patterns 52 are formed on a supporting member 51 (FIG. 19a). As the supporting member, an insulating base material such as a polyimide film can be used besides a metal foil such as an electrolytic copper foil. When an insulating base material is used, there are two methods. According to the first method, nonthrough-holes reaching the wiring patterns are formed at predetermined positions of the insulating base material, and external connection terminals are formed at exposed portions of the wiring patterns. The nonthrough-holes can be formed by applying an excimer laser or a $CO_2$ laser and so on. According to the second method, a drilled insulating base material provided with an adhesive is formed in advance and, subsequent to lamination with an electrolytic copper foil or the like, the copper foil is subjected to etching.

When a metal foil is used, on the other hand, a resist pattern is formed with a photoresist and wiring patterns are then formed by electroplating while using the metal foil as a cathode. In this case, it is possible to use a conventional electrolytic copper foil and a foil consisting of an electrolytic copper foil and a thin layer of a metal (nickel, gold, solder or the like) different in chemical etching conditions from the copper foil provided thereon. Further, copper is preferred for the wiring patterns. However, when an electrolytic copper foil is used as a supporting member as mentioned above, it is necessary to use a metal, which is different in etching conditions from the copper foil, for the wiring patterns or to form a patterned thin layer, which will serve as a barrier layer upon etching the copper foil, before application of a patterned copper plating.

Next, after semiconductor devices 54 are mounted by die-bonding materials 53, terminals of the semiconductor devices and wiring patterns are electrically connected (FIG. 19b), and plural sets of the semiconductor devices and wiring patterns are all together sealed with a resinous sealing material 56 by the transfer molding process (FIG. 19c). No particular limitation is imposed on the resinous sealing material and, for example, an epoxy resin containing 5 to 80 wt. % of silica of about 10 to 20 μm in diameter can be used. The present invention is not limited to cases making use of a face-up method as a mounting method for semiconductor devices but is also applicable to cases making use of a face-down method. Specifically, it is only necessary to form bumps for face-down bonding at predetermined positions on the wiring patterns 52 by a plating process or the like and then to electrically connect external connecting portions of the semiconductor devices with the bumps. Further, it is effective to make to packages easy to divide in a subsequent step as shown in FIG. 20 and FIG. 21. Of these, FIG. 20 shows grooves 59 formed in boundary portions between individual package portions. The width, depth and the like of each groove can be modified depending on the dimensions which the die for transfer mold can receive for processing. Further, FIG. 21 illustrates a transfer molding process which is carried out using a grid-shaped intermediate plate 60 hollowed out beforehand at areas corresponding to the individual package portions. Where the supporting member is a metal foil, the supporting member is removed by a chemical etching process and external connection terminals 57 are formed at predetermined positions (FIG. 19d). When an insulating base material is used as a supporting member, it is only necessary to selectively remove the insulating base material at predetermined areas by a laser or the like. Finally, the substrate which has been sealed as a whole is cut apart into unit portions 58. Incidentally, a solder resist layer may be formed on exposed surfaces of the wiring patterns for protecting the wiring patterns.

The seventeenth embodiment will be described specifically.

SPECIFIC EXAMPLE 3

On a shiny surface of an electrolytic copper foil of 35 μm in thickness and 250 mm squares in external shape, a photosensitive dry film resist ("PHOTEC HN640", trade name; product of Hitachi Chemical Co., Ltd.) was laminated, followed by exposure and development so that a desired resist pattern (minimum line/space=50 μm/50 μm) was formed. As many as 300 (4 blocks/250 mm squares, 75 patterns/block) identical wiring patterns which were each consisted of 0.2 μm thick nickel, 30 μm thick copper, 5 μm thick nickel and 1 μm thick soft gold were next formed by an electroplating method. The resist pattern was next stripped off using a 3 wt. % solution of potassium hydroxide of 35° C. The resultant assembly was dried at 85° C. for 15 minutes and then cut into the individual blocks. Using a semiconductor-device-mounting die-bonding material ("HM-1", trade name; product of Hitachi Chemical Co., Ltd.), semiconductor devices were then bonded. The bonding conditions were set as follows—press pressure: 5 kg/cm$^2$, temperature: 380° C., and compression-bonding time: 5 seconds. External terminals of each semiconductor device were then electrically connected with its corresponding gold-plated terminal portions (second connecting portions) by wire bonding. The thus-obtained assembly was loaded in a die for transfer mold. Using a semiconductor-sealing epoxy resin ("CL-7700", trade name; product of Hitachi Chemical Co., Ltd.), the 75 wiring patterns (corresponding to 1 block) were sealed all together at 185° C. for 90 seconds so that the individual wiring patterns were transferred into the sealing material. Next, the electrolytic copper foil was etched off at desired portions with an alkali etchant ("A Process", trade name; product of Japan Meltex, Inc.). The temperature and spraying pressure of the etching solution were 400° C. and 1.2 kgf/cm$^2$, respectively. Solder patterns were then formed at external connection terminal portions by a printing process. The solder was caused to fuse in an infrared reflowing oven, so that external connection bumps were formed. Finally, the assembly was divided into individual package portions by a diamond cutter so that packages were obtained as desired.

SPECIFIC EXAMPLE 4

On a shiny surface of an electrolytic copper foil of 35 μm in thickness and 250 mm squares in external shape, a photosensitive dry film resist ("PHOTEC HN640", trade name; product of Hitachi Chemical Co., Ltd.) was laminated, followed by exposure and development so that a desired resist pattern (minimum line/space=50 μm/50 μm). As many as 300 (4 blocks/250 mm squares, 75 patterns/block) identical wiring patterns which were each consisted of 0.2 μm thick nickel, 30 μm thick copper, 5 μm thick nickel and 1 μm thick soft gold were next formed by an electroplating method. The resist pattern was next stripped off using a 3 wt. % solution of potassium hydroxide of 35° C. The resultant assembly was dried at 85° C. for 15 minutes and then cut into the individual blocks. Using a semiconductor-device-mounting die-bonding material ("HM-1", trade name; product of Hitachi Chemical Co., Ltd.), the semiconductor devices were then bonded. The bonding conditions were set as follows—press pressure: 5 kg/cm$^2$, temperature: 380° C., and compression-bonding time: 5 seconds. External terminals of each semiconductor device were then electrically connected with its corresponding gold-plated terminal portions (second connecting portions) by wire bonding. Using as an intermediate plate a grid-shaped stainless steel plate hollowed out at areas corresponding to individual package areas, the thus-obtained assembly was loaded in a die for transfer mold. Using a semiconductor-sealing epoxy resin ("CL-7700", trade name; product of Hitachi Chemical Co., Ltd.), the 75 wiring patterns (corresponding to 1 block) were sealed all together at 185° C. for 90 seconds so that the individual wiring patterns were transferred into the sealing material. A grid portion of the intermediate plate was tapered at 12° to facilitate separation of the individual packages from the intermediate plate. Next, the electrolytic copper foil was etched off at desired portions with an alkali etchant ("A Process", trade name; product of Japan Meltex, Inc.). Each package portion is held in place by the grid-shaped intermediate plate. The temperature and spraying pressure of the etching solution were 40° C. and 1.2 kgf/cm$^2$, respectively. Finally, solder patterns were formed at external connection terminal portions by a printing process. The solder was caused to fuse in an infrared reflowing oven, so that external connection bumps were formed. Individual package portions were separated from the intermediate plate so that packages were obtained as desired.

With reference to FIG. 22, a description will be given of the eighteenth embodiment of the present invention.

Figure 22A:
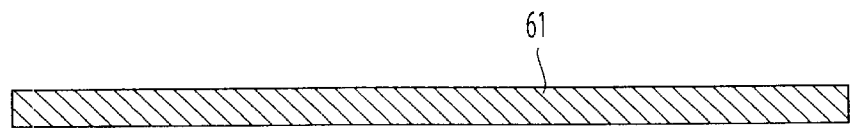
FIG. 22 is a cross-sectional view illustrating a process according to an embodiment of the present invention for the fabrication of a semiconductor package.
Figure 22B:
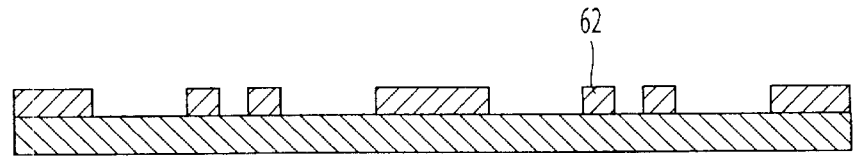
Figure 22C:
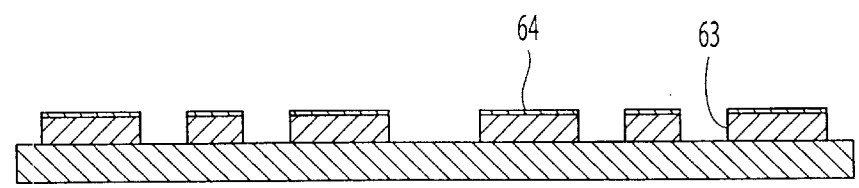

Plural sets of predetermined resist patterns 62 (FIG. 22b) are formed on an electrically-conductive temporary supporting member 61 (FIG. 22a). Next, wiring patterns 63 are formed at exposed portions of the temporary supporting member by an electroplating process. In this case, no particular limitation is imposed on the temporary supporting member. For example, it is possible to use a conventional electrolytic copper foil and a foil consisting of an electrolytic copper foil and a thin layer of a metal (nickel, gold, solder or the like) different in chemical etching conditions from the copper foil provided thereon. Further, copper is preferred for the wiring patterns. However, when an electrolytic copper foil is used as a temporary supporting member as mentioned above, it is necessary to use a metal, which is different in etching conditions from the copper foil, for the wiring patterns or to form a patterned thin layer, which will serve as a barrier layer upon etching the copper foil, before application of a patterned copper plating. No particular limitation is imposed on the thickness of the temporary supporting member insofar as no inconvenience or problem arises in matters such as the handling in subsequent steps and the dimensional stability upon packaging semiconductor devices. After a plating (usually, nickel/gold) 64 which is to be used for gold wire bonding is applied using the temporary supporting member as a cathode, the resist pattern is removed (FIG. 22c). The present invention is not limited to cases making use of a face-up method as a mounting method for semiconductor devices but is also applicable to cases making use of a face-down method for example. Specifically, it is only necessary to form bumps for face-down bonding at predetermined positions on the wiring patterns 63 by a plating process or the like and then to electrically connect external connecting portions of the semiconductor devices with the bumps.

Figure 22D:
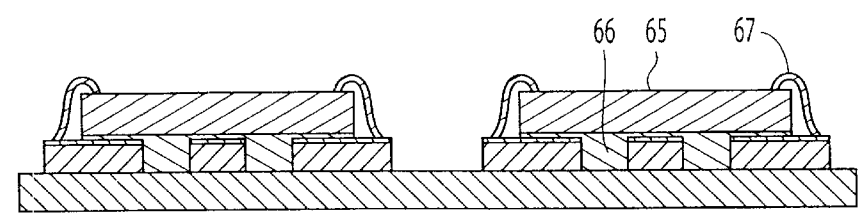
Figure 22E:
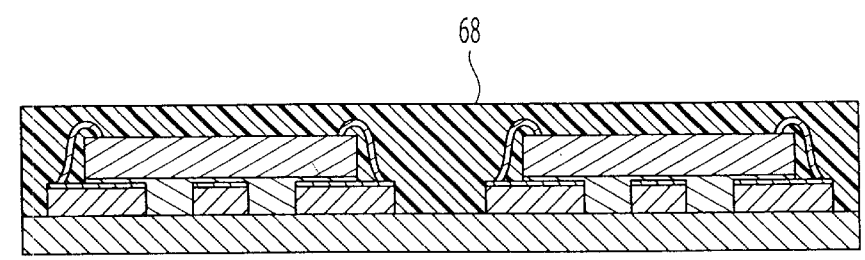

Next, after semiconductor devices 65 are bonded by die-bonding materials 66, external connection terminals of the semiconductor devices and their corresponding wiring patterns are electrically connected (FIG. 22d). The resultant assembly is then loaded in a die for transfer mold and is sealed with a resinous sealing material 68 (FIG. 22e). In this case, no particular limitation is imposed on the resinous sealing material and, for example, an epoxy resin containing 5 to 80 wt. % of silica of about 10 to 20 μm in diameter can be used.

Figure 22F:
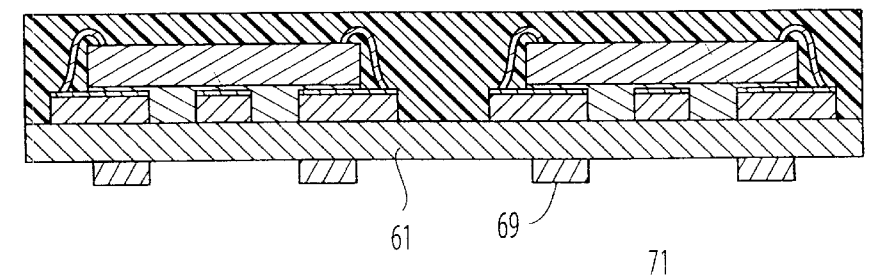
Figure 22G:
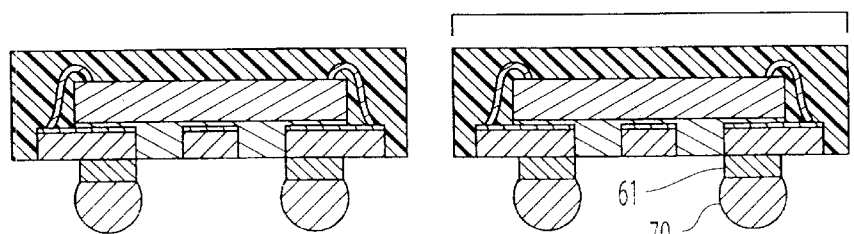

Then, predetermined metal patterns 69 are formed at positions corresponding to the external connection terminals (FIG. 22f). In this case, any metal can be used insofar as it is not etched under conditions for etching off the electrically-conductive temporary supporting member. For example, solder, gold, nickel/gold or the like can be used. As a process for the formation of the metal patterns, a known electroplating process or solder printing process can be applied. Further, when forming solder patterns as the metal patterns 69 by a printing process, solder bumps 70 can be formed by reflowing. In this case, by adjusting the thickness of the patterns 69, it is possible to control the height of the reflowed solder bumps 70. The temporary supporting member is next removed at predetermined portions while using the metal patterns as an etching resist, whereby the wiring patterns are exposed. Finally, the assembly is divided into individual packages 71 by stamping or dicing (FIG. 22g). Incidentally, where the exposed wiring patterns are not protected by a corrosion-resistant metal such as nickel, areas other than the external connection terminal portions may be coated with a known solder resist or the like. When using solder as metal patterns, no particular limitation is imposed on the reflowing step. The reflowing step can be performed either before or after dividing the assembly into the individual packages. As a further alternative, the reflowing step can also be conducted before mounting the individual packages on external wiring boards.

The eighteenth embodiment will be described specifically.

SPECIFIC EXAMPLE 5

On a shiny surface of an electrolytic copper foil of 70 μm in thickness, a photosensitive dry film resist ("PHOTEC HN640", trade name; product of Hitachi Chemical Co., Ltd.) was laminated, followed by exposure and development so that a desired resist pattern (minimum line/space=50 μm/50 μm) was formed. Wiring patterns which were each consisted of 0.2 μm thick nickel, 30 μm thick copper, 5 μm thick nickel and 1 μm thick soft gold were next formed by an electroplating method. The resist pattern was next stripped off using a 3 wt. % solution of potassium hydroxide of 35° C. After the resultant assembly was dried at 85° C. for 15 minutes, semiconductor devices were bonded using a semiconductor-device-mounting die-bonding material ("HM-1", trade name; product of Hitachi Chemical Co., Ltd.). The bonding conditions were set as follows—press pressure: 5 kgf/cm$^2$, temperature: 380° C., and compression-bonding time: 5 seconds. External terminals of each semiconductor device were then electrically connected with its corresponding gold-plated terminal portions (second connecting portions) by wire bonding. The thus-obtained assembly was loaded in a die for transfer mold. Using a semiconductor-sealing epoxy resin ("CL-7700", trade name; product of Hitachi Chemical Co., Ltd.), the assembly was sealed at 185° C. for 90 seconds so that the wiring patterns were transferred into the sealing material. Next, a photosensitive dry film resist ("PHOTEC HN340", trade name; product of Hitachi Chemical Co., Ltd.) was laminated on an electrolytic copper foil, followed by exposure and development so that a desired resist pattern was formed. A 40 μm thick solder pad (diameter: 0.3 mm, arrangement pitch: 1.0 mm) was formed by an electroplating method. Next, after the dry film resist was stripped off, the electroplated copper foil was etched off at desired portions with an alkali etchant ("A Process", trade name; product of Japan Meltex, Inc.). The temperature and spraying pressure of the etching solution were 40° C. and 1.2 kgf/cm$^2$, respectively. Finally, the solder was caused to fuse in an infrared reflowing oven, so that external connection bumps were formed.

Figure 23:
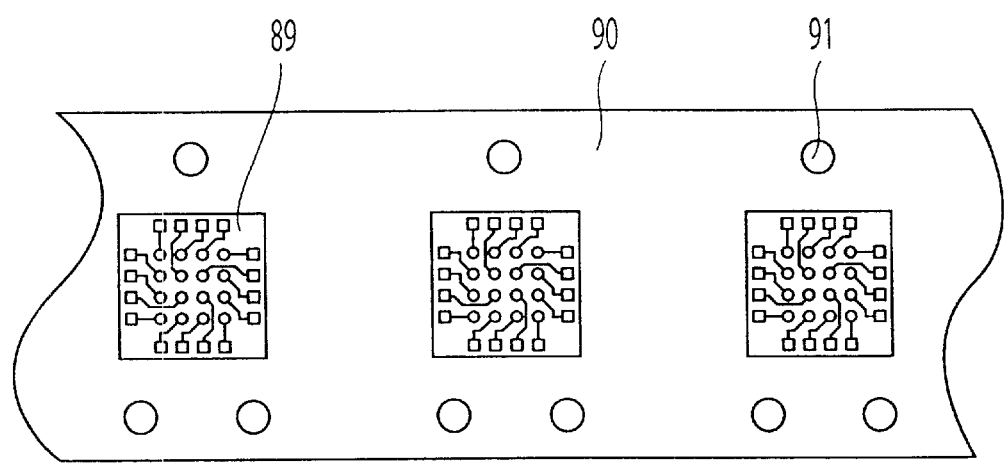
FIG. 23 is a plan view illustrating a process according to an embodiment of the present invention for the fabrication of a semiconductor package.

With reference to FIGS. 23, 24 and 25, a description will be given of the nineteenth embodiment of the present invention.

The construction of a semiconductor mounting frame will be described with reference to FIG. 23. Numeral 89 indicates semiconductor-mounting substrates, each of which consisted of an insulating base material and wiring. Plural substrates are connected together via connecting portions 90. Each connecting portion 90 is provided with pinholes 91 as reference positions. Recognition marks employed in image recognition may be used in place of the pinholes 91. Based on these reference positions, positioning is performed in subsequent steps. Especially upon molding semiconductors with resin, positional registration is effected by inserting pins, which are arranged inside a cavity, in the pinholes 91.

Referring to FIGS. 24 and 25, a further description will be given. A nickel layer of 0.001 mm in thickness (not shown in FIGS. 24 and 25) was formed by an electrolytic plating process on one side of an electrolytic copper foil 81 of about 0.070 mm in thickness which is an electrically-conductive temporary substrate. Next, a photosensitive dry film resist ("PHOTEC HN340", trade name; product of Hitachi Chemical Co., Ltd.) was laminated, followed by exposure and development so that a plating resist for plural sets of wiring patterns was formed. The intensity of the exposure at this time is 70 mJ/cm$^2$. Further, electrolytic copper plating is conducted in a known copper sulfate bath and the resist is stripped off, whereby plural sets of wiring 82 are formed (FIG. 24*a*, FIG. 25*a*). Here, as is illustrated in FIG. 25*a*, it may be contemplated to form plated copper 82' at the connecting portions too. This makes it possible to provide the resulting frame with still enhanced rigidity. Each of the constructions shown in FIG. 24*a* and FIG. 25*a* can also be obtained by providing beforehand a base material composed of three layers of copper/thin nickel layer/copper and forming one of the copper foils into wiring in a usual etching step. Further, the construction of the copper foil 81/thin nickel layer (not shown)/copper wirings 82 (and 82') obtained here may be replaced by a two-layer structure free of the thin nickel layer, such as copper foil/nickel wirings, nickel foil/copper wirings, or the like. Although the selectable kinds of metals are not limited to those of the present embodiment, it is a preferred standard for the selection to allow wirings to selectively remain when some parts of the temporary substrate are etched off in a subsequent step (FIG. 24*c*, FIG. 25*c*). As the electrically-conductive temporary substrate becomes a material which makes up the connecting portions of the frame, a greater thickness is preferred. There is however a subsequent step to etch it off partly, so that it is necessary to select an appropriate thickness. The thickness of the electrically-conductive temporary substrate varies depending on the material. For example, when a copper foil is used, about 0.03 to 0.3 mm or so is preferred. A polyimide adhesive 83 is next applied to the wiring-containing surface of the copper foil 81 with the plural sets of wiring 82 formed thereon. Here, the polyimide adhesive 83 is not limited to this material. It is possible to use, for example, an epoxy adhesive film, a film formed of a polyimide film and an adhesive coated thereon, or the like. Next, holes 84 for the external connection terminals are formed using an excimer laser (FIG. 24*b*, FIG. 25*b*). For the sake of simplification of subsequent steps, it is suited to arrange connecting terminals before mounting semiconductors. As another method for the formation of these holes 84, it is possible to form beforehand the holes 84 for the external connection terminals in a film by drilling or punching and then to bond the film so formed. Although no problem or inconvenience would arise even if a metal to be employed as the connecting terminals (which are designated at numeral 88 in FIG. 24*f* and FIG. 25*f*), such as a solder or the like, is filled at this stage, the resulting metal bumps may become an obstacle in the subsequent semiconductor mounting step and resin sealing step. Thus, it is preferred to form a metal at a subsequent step. It is preferred to locate the holes for the external connection terminals (or terminals) in the mounting substrate portions for the semiconductor devices, in the form of arrays on the side opposite to the side on which the semiconductor devices are mounted.

Figure 24A:
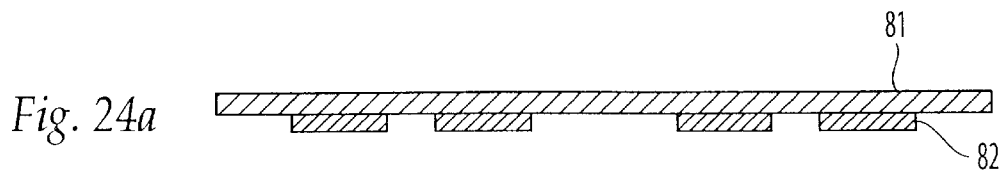
FIG. 24 is a cross-sectional view illustrating the process according to an embodiment of the present invention for the fabrication of the semiconductor package.
Figure 24B:
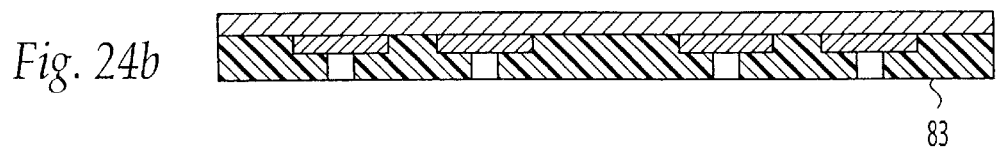
Figure 24C:
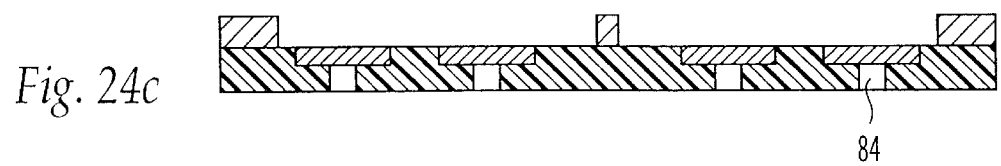

Next, a portion of the electrolytic copper foil as the temporary substrate, the portion being the area where the wiring patters are formed, was etched off. As this etching solution, it is preferred to choose an etching solution and etching conditions, which in the case of this embodiment, provide a substantially higher dissolution velocity for copper than for nickel. Employed in this embodiment are an alkali etchant ("A Process", trade name; product of Japan Meltex Inc.) as an etching solution and, for example, a solution temperature of 40° C. and a spray pressure of 1.2 kgf/cm². It is to be noted that the kind of solution and the conditions specified here are merely illustrative. By this step, the thin nickel layer in the substrate is exposed. Upon etching only this thin nickel layer, it is preferred to choose an etching solution and etching conditions so that a substantially higher dissolution velocity is provided for nickel than for copper. In this embodiment, selective etching was conducted with a nickel etchant ("Melstrip N950", trade name; product of Japan Meltex, Inc.). The temperature and spraying pressure of the etching solution were set at 40° C. and 1.2 kgf/cm², respectively. It is to be noted that the kind of the solution and conditions specified here are merely illustrative. Through these steps, the temporary substrate is allowed to remain as the connecting portions, whereby a semiconductor mounting frame having rigidity is obtained (FIG. 24*c*, FIG. 25*c*). In this embodiment, electroless nickel-gold plating is applied to terminal portions of the copper wirings on this frame (not shown). This is needed for wire-bonding chips in a subsequent step. Such surface treatment can be applied as needed.

Figure 24D:
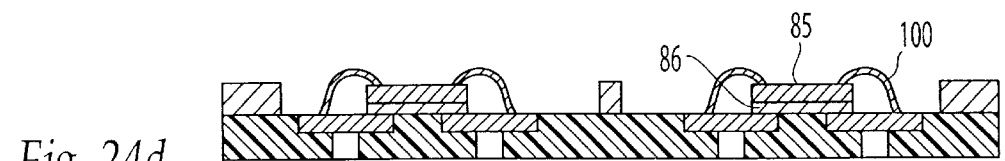
Figure 24E:
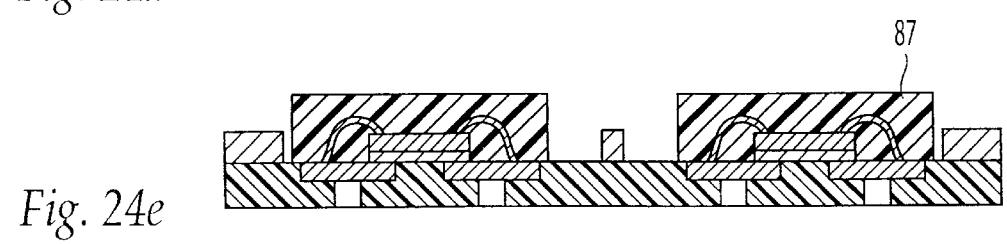
Figure 24F:
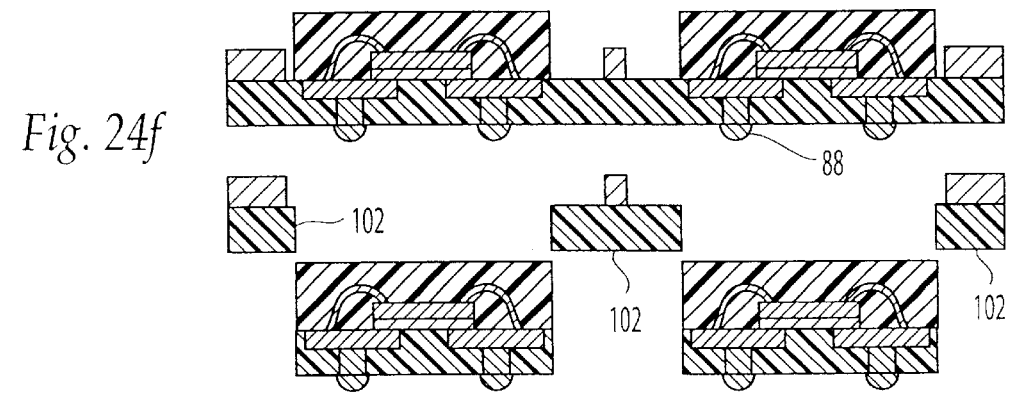
Figure 24G:

Semiconductor chips 85 are then mounted. For bonding the semiconductor chips, semiconductor die-bonding tapes 86 (for example, "HM-1", trade name; product of Hitachi Chemical Co., Ltd.) were used. If there is no wiring under the chips, the chips may be bonded using a die-bonding silver paste. Next, terminal portions of the semiconductors and the wiring are connected by wire bonds 100 (FIG. 24*d*, FIG. 25*d*). The connection with the terminals of the semiconductors can be effected by another method, for example, by face-down connection making use of Flip chips or by bonding making use of an anisotropic conductive adhesive. The assembly so formed is loaded in a die for transfer mold and is sealed using a semiconductor-sealing epoxy resin ("CL-7700", trade name; product of Hitachi Chemical Co., Ltd.) 87 (FIG. 24*e*, FIG. 25*e*). Thereafter, solder balls 88 are the connecting holes formed at connecting terminal portions of the wiring 82 and are then caused to fuse (FIG. 24*f*, FIG. 25*f*). These solder balls 88 become so-called external connection terminals. The plural semiconductor devices connected together by the connecting portions 102 are punched by dies, so that the individual semiconductor devices are obtained (FIG. 24*g*, FIG. 25*g*).

In this embodiment, the semiconductor mounting frame and semiconductor device fabrication process make it possible to obtain a frame having sufficient rigidity in the fabrication of semiconductor devices, such as BGAs, CSPs or the like, by using a film-shaped substrate such as a polyimide tape and so on. By using this frame, semiconductor devices can be fabricated with high accuracy and efficiency.

Owing to the present invention, semiconductor packages capable of meeting the move toward higher integration of semiconductor chips can be fabricated stably with good productivity.

What is claimed is:

1. A method of producing a substrate for mounting semiconductor devices thereon, said substrate having an insulating supporting member and plural sets of wiring formed on one side of said insulating supporting member comprising the steps of:

forming on a surface of said insulating supporting member, plural sets of a semiconductor device mounting region and a resin-sealing semiconductor package region outside of said semiconductor device mounting region;

forming said wiring comprising the steps of forming a wire-bonding terminals in said semiconductor package region, forming external connecting terminals in said semiconductor device mounting region; and forming wirings that connect said wire-bonding terminals with said external connecting terminals, and forming openings reaching to the external connecting terminals in said insulating supporting member at portions where said external connection terminals were formed.

2. The method of producing a substrate for mounting semiconductor devices thereon according to claim 1, wherein said method further comprises the step of plating nickel and gold on a surface of said wiring.

3. The method of producing a substrate for mounting semiconductor devices thereon according to claim 1, wherein said insulating supporting member is a polyimide film.

4. The method of producing a substrate for mounting semiconductor devices thereon according to claim 1, wherein said external connecting terminals are arranged in a grid pattern in said semiconductor device mounting region.

5. The method of producing a substrate for mounting semiconductor devices thereon according to claim 1, wherein said openings are formed at least by any of stamping, drilling, laser beam machining and wet etching.

6. The method of producing a substrate for mounting semiconductor devices thereon according to claim 1, wherein said insulating supporting member comprises an adhesive layer on its surface, and said method further comprises, after forming said openings, a step of bonding said insulating supporting member and a piece of metallic foil via said adhesive layer, wherein in the step of forming said wiring, said wiring is formed by etching said piece of metallic foil thus bonded.

7. The method of producing a substrate for mounting semiconductor devices thereon according to claim 1, wherein said insulating supporting member comprises a piece of metallic foil on its surface, and in the step of forming said wiring, said wiring is formed by etching said piece of metallic foil.

8. A substrate for mounting semiconductor devices thereon having an insulating supporting member and plural sets of wiring formed on one side of said insulating supporting member, comprising:
  plural sets of a semiconductor device mounting region and a resin-sealing semiconductor package region outside of said semiconductor device mounting region, wherein said wirings comprise
    wire bonding terminals formed in said semiconductor package region, external connecting terminals formed in said semiconductor device mounting region; and
    wirings that connect the wire bonding terminals and the external connecting terminals, and
    wherein openings reaching to the external connecting terminals are provided in said insulating supporting member at portions where said external connecting terminals are formed.

9. The substrate for mounting semiconductor devices thereon according to claim 8, wherein each of said plural sets of wiring comprises a nickel and gold plate layer on its surface.

10. The substrate for mounting semiconductor devices thereon according to claim 8, wherein said insulating supporting member is a polyimide film.

11. The substrate for mounting semiconductor devices thereon according to claim 8, wherein said external connecting terminals are arranged in a grid pattern on said semiconductor device mounting region.

12. The substrate for mounting semiconductor devices thereon according to claim 8, wherein said openings are formed at least by any of stamping, drilling, laser beam machining and wet etching.

13. A semiconductor package comprising:
  the substrate for mounting semiconductor devices thereon according to claim 8,
  a semiconductor device mounted on said semiconductor device mounting region of said substrate via a die-bonding material; and
  a sealing-resin provided in said semiconductor package region.

14. The semiconductor package according to claim 13, wherein said die-bonding material is a die-bonding film.

* * * * *